US007201936B2

(12) United States Patent
Schwarm et al.

(10) Patent No.: US 7,201,936 B2
(45) Date of Patent: *Apr. 10, 2007

(54) METHOD OF FEEDBACK CONTROL OF SUB-ATMOSPHERIC CHEMICAL VAPOR DEPOSITION PROCESSES

(75) Inventors: Alexander T. Schwarm, Austin, TX (US); Arulkumar P. Shanmugasundram, Sunnyvale, CA (US); Rong Pan, Daly City, CA (US); Manuel Hernandez, Sunnyvale, CA (US); Amna Mohammad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/174,377

(22) Filed: Jun. 18, 2002

(65) Prior Publication Data

US 2003/0049376 A1 Mar. 13, 2003

Related U.S. Application Data

(60) Provisional application No. 60/366,698, filed on Mar. 21, 2002, provisional application No. 60/349,576, filed on Oct. 29, 2001, provisional application No. 60/298,878, filed on Jun. 19, 2001.

(51) Int. Cl.
*C23C 16/52* (2006.01)

(52) U.S. Cl. ............................ 427/8; 427/9; 427/248.1; 427/255.23

(58) Field of Classification Search ............. 427/248.1, 427/255.23, 8, 9
See application file for complete search history.

(56) References Cited

U.S. PATENT DOCUMENTS 3,205,485 A 9/1965 Noltingk (Continued)

FOREIGN PATENT DOCUMENTS

CA 2050247 8/1991

(Continued)

OTHER PUBLICATIONS

IslamRaja, M.M. et al., "Two precursor model for low-pressure chemical vapor deposition of silicon dioxide from tetraethylorthosilicate." J. Vac. Sci. Technol. B 11(3), May/Jun. 1993, pp. 720-726.*

(Continued)

*Primary Examiner*—Bret Chen
(74) *Attorney, Agent, or Firm*—Wilmer, Cutler & Hale

(57) ABSTRACT

A method of film deposition in a sub-atmospheric chemical vapor deposition (CVD) process includes (a) providing a model for sub-atmospheric CVD deposition of a film that identifies one or more film properties of the film and at least one deposition model variable that correlates with the one or more film properties; (b) depositing a film onto a wafer using a first deposition recipe comprising at least one deposition recipe parameter that corresponds to the at least one deposition variable; (c) measuring a film property of at least one of said one or more film properties for the deposited film of step (b); (d) calculating an updated deposition model based upon the measured film property of step (c) and the model of step (a); and (e) calculating an updated deposition recipe based upon the updated model of step (d) to maintain a target film property. The method can be used to provide feedback to a plurality of deposition chambers or to control a film property other than film thickness.

31 Claims, 8 Drawing Sheets

U.S. PATENT DOCUMENTS

| | | | |
|---|---|---|---|
| 3,229,198 A | 1/1966 | Libby | |
| 3,767,900 A | 10/1973 | Chao et al. | |
| 3,920,965 A | 11/1975 | Sohrwardy | |
| 4,000,458 A | 12/1976 | Miller et al. | |
| 4,207,520 A | 6/1980 | Flora et al. | |
| 4,209,744 A | 6/1980 | Gerasimov et al. | |
| 4,302,721 A | 11/1981 | Urbanek et al. | |
| 4,368,510 A | 1/1983 | Anderson | |
| 4,609,870 A | 9/1986 | Lale et al. | |
| 4,616,308 A | 10/1986 | Morshedi et al. | |
| 4,663,703 A | 5/1987 | Axelby et al. | |
| 4,698,766 A | 10/1987 | Entwistle et al. | |
| 4,717,596 A * | 1/1988 | Barbee et al. | 427/248.1 |
| 4,750,141 A | 6/1988 | Judell et al. | |
| 4,755,753 A | 7/1988 | Chern | |
| 4,757,259 A | 7/1988 | Charpentier | |
| 4,796,194 A | 1/1989 | Atherton | |
| 4,901,218 A | 2/1990 | Cornwell | |
| 4,938,600 A | 7/1990 | Into | |
| 4,957,605 A | 9/1990 | Hurwitt et al. | |
| 4,967,381 A | 10/1990 | Lane et al. | |
| 4,974,543 A | 12/1990 | Jansen | |
| 5,089,970 A | 2/1992 | Lee et al. | |
| 5,108,570 A | 4/1992 | Wang | |
| 5,208,765 A | 5/1993 | Turnbull | |
| 5,220,517 A | 6/1993 | Sierk et al. | |
| 5,226,118 A | 7/1993 | Baker et al. | |
| 5,231,585 A | 7/1993 | Kobayashi et al. | |
| 5,236,868 A | 8/1993 | Nulman | |
| 5,240,552 A | 8/1993 | Yu et al. | |
| 5,260,868 A | 11/1993 | Gupta et al. | |
| 5,283,141 A | 2/1994 | Yoon et al. | |
| 5,295,242 A | 3/1994 | Mashruwala et al. | |
| 5,309,221 A | 5/1994 | Fischer et al. | |
| 5,329,463 A | 7/1994 | Sierk et al. | |
| 5,338,630 A | 8/1994 | Yoon et al. | |
| 5,347,446 A | 9/1994 | Iino et al. | |
| 5,367,624 A | 11/1994 | Cooper | |
| 5,369,544 A | 11/1994 | Mastrangelo | |
| 5,398,336 A | 3/1995 | Tantry et al. | |
| 5,402,367 A | 3/1995 | Sullivan et al. | |
| 5,408,405 A | 4/1995 | Mozumder et al. | |
| 5,410,473 A | 4/1995 | Kaneko et al. | |
| 5,420,796 A | 5/1995 | Weling et al. | |
| 5,427,878 A | 6/1995 | Corliss | |
| 5,444,837 A | 8/1995 | Bomans et al. | |
| 5,469,361 A | 11/1995 | Moyne | |
| 5,485,082 A | 1/1996 | Wisspeintner et al. | |
| 5,490,097 A | 2/1996 | Swenson et al. | |
| 5,495,417 A | 2/1996 | Fuduka et al. | |
| 5,497,316 A | 3/1996 | Sierk et al. | |
| 5,497,381 A | 3/1996 | O'Donoghue et al. | |
| 5,503,707 A | 4/1996 | Maung et al. | |
| 5,508,947 A | 4/1996 | Sierk et al. | |
| 5,511,005 A | 4/1996 | Abbe et al. | |
| 5,519,605 A | 5/1996 | Cawlfield | |
| 5,525,808 A | 6/1996 | Irie et al. | |
| 5,526,293 A | 6/1996 | Mozumder et al. | |
| 5,534,289 A | 7/1996 | Bilder et al. | |
| 5,535,128 A * | 7/1996 | Laube et al. | 700/119 |
| 5,541,510 A | 7/1996 | Danielson | |
| 5,546,312 A | 8/1996 | Mozumder et al. | |
| 5,553,195 A | 9/1996 | Meijer | |
| 5,586,039 A | 12/1996 | Hirsch et al. | |
| 5,602,492 A | 2/1997 | Cresswell et al. | |
| 5,603,707 A | 2/1997 | Trombetta et al. | |
| 5,617,023 A | 4/1997 | Skalski | |
| 5,621,241 A | 4/1997 | Jain | |
| 5,627,083 A | 5/1997 | Tounai | |
| 5,629,216 A | 5/1997 | Wijaranakula et al. | |
| 5,642,296 A | 6/1997 | Saxena | |
| 5,646,870 A | 7/1997 | Krivokapic et al. | |
| 5,649,169 A | 7/1997 | Berezin et al. | |
| 5,654,903 A | 8/1997 | Reitman et al. | |
| 5,655,951 A | 8/1997 | Meikle et al. | |
| 5,657,254 A | 8/1997 | Sierk et al. | |
| 5,660,895 A | 8/1997 | Lee et al. | |
| 5,661,669 A | 8/1997 | Mozumder et al. | |
| 5,663,797 A | 9/1997 | Sandhu | |
| 5,664,987 A | 9/1997 | Renteln | |
| 5,665,199 A | 9/1997 | Sahota et al. | |
| 5,665,214 A | 9/1997 | Iturralde | |
| 5,666,297 A | 9/1997 | Britt et al. | |
| 5,667,424 A | 9/1997 | Pan | |
| 5,674,787 A | 10/1997 | Zhao et al. | |
| 5,694,325 A | 12/1997 | Fukuda et al. | |
| 5,695,810 A | 12/1997 | Dubin et al. | |
| 5,698,989 A | 12/1997 | Nulman | |
| 5,719,495 A | 2/1998 | Moslehi | |
| 5,719,796 A | 2/1998 | Chen | |
| 5,735,055 A | 4/1998 | Hochbein et al. | |
| 5,740,429 A | 4/1998 | Wang et al. | |
| 5,751,582 A | 5/1998 | Saxena et al. | |
| 5,754,297 A * | 5/1998 | Nulman | 356/630 |
| 5,761,064 A | 6/1998 | La et al. | |
| 5,761,065 A | 6/1998 | Kittler et al. | |
| 5,764,543 A | 6/1998 | Kennedy | |
| 5,777,901 A | 7/1998 | Berezin et al. | |
| 5,787,021 A | 7/1998 | Samaha | |
| 5,787,269 A | 7/1998 | Hyodo | |
| 5,808,303 A | 9/1998 | Schlagheck et al. | |
| 5,812,407 A | 9/1998 | Sato et al. | |
| 5,823,854 A | 10/1998 | Chen | |
| 5,824,599 A | 10/1998 | Schacham-Diamand et al. | |
| 5,825,356 A | 10/1998 | Habib et al. | |
| 5,825,913 A | 10/1998 | Rostami et al. | |
| 5,828,778 A | 10/1998 | Hagi et al. | |
| 5,831,851 A | 11/1998 | Eastburn et al. | |
| 5,832,224 A | 11/1998 | Fehskens et al. | |
| 5,838,595 A | 11/1998 | Sullivan et al. | |
| 5,838,951 A | 11/1998 | Song | |
| 5,857,258 A | 1/1999 | Penzes et al. | |
| 5,859,777 A | 1/1999 | Yokoyama et al. | |
| 5,859,964 A | 1/1999 | Wang et al. | |
| 5,859,975 A | 1/1999 | Brewer et al. | |
| 5,862,054 A | 1/1999 | Li | |
| 5,863,807 A | 1/1999 | Jang et al. | |
| 5,867,389 A | 2/1999 | Hamada et al. | |
| 5,870,306 A | 2/1999 | Harada | |
| 5,871,805 A * | 2/1999 | Lemelson | 427/8 |
| 5,874,345 A | 2/1999 | Coronel et al. | |
| 5,883,437 A | 3/1999 | Maruyama et al. | |
| 5,901,313 A | 5/1999 | Wolf et al. | |
| 5,903,455 A | 5/1999 | Sharpe, Jr. et al. | |
| 5,910,011 A | 6/1999 | Cruse | |
| 5,910,846 A | 6/1999 | Sandhu | |
| 5,912,678 A | 6/1999 | Saxena et al. | |
| 5,916,016 A | 6/1999 | Bothra | |
| 5,923,553 A | 7/1999 | Yi | |
| 5,926,690 A | 7/1999 | Toprac et al. | |
| 5,930,138 A | 7/1999 | Lin et al. | |
| 5,937,323 A | 8/1999 | Orczyk et al. | |
| 5,940,300 A | 8/1999 | Ozaki | |
| 5,943,237 A | 8/1999 | Van Boxem | |
| 5,943,550 A | 8/1999 | Fulford, Jr. et al. | |
| 5,960,185 A | 9/1999 | Nguyen | |
| 5,960,214 A | 9/1999 | Sharpe, Jr. et al. | |
| 5,961,369 A | 10/1999 | Bartels et al. | |
| 5,963,881 A | 10/1999 | Kahn et al. | |
| 5,975,994 A | 11/1999 | Sandhu et al. | |
| 5,978,751 A | 11/1999 | Pence et al. | |
| 5,982,920 A | 11/1999 | Tobin, Jr. et al. | |
| 6,002,989 A | 12/1999 | Shiba et al. | |
| 6,012,048 A | 1/2000 | Gustin et al. | |

| | | |
|---|---|---|
| 6,017,771 A | 1/2000 | Yang et al. |
| 6,036,349 A | 3/2000 | Gombar |
| 6,037,664 A | 3/2000 | Zhao et al. |
| 6,041,263 A | 3/2000 | Boston et al. |
| 6,041,270 A | 3/2000 | Steffan et al. |
| 6,054,379 A | 4/2000 | Yau et al. |
| 6,059,636 A | 5/2000 | Inaba et al. |
| 6,064,759 A | 5/2000 | Buckley et al. |
| 6,072,313 A | 6/2000 | Li et al. |
| 6,074,443 A | 6/2000 | Venkatesh et al. |
| 6,077,412 A | 6/2000 | Ting et al. |
| 6,078,845 A | 6/2000 | Friedman |
| 6,094,688 A | 7/2000 | Mellen-Garnett et al. |
| 6,096,649 A | 8/2000 | Jang |
| 6,097,887 A | 8/2000 | Hardikar et al. |
| 6,100,195 A | 8/2000 | Chan et al. |
| 6,108,092 A | 8/2000 | Sandhu |
| 6,111,634 A | 8/2000 | Pecen et al. |
| 6,112,130 A | 8/2000 | Fukuda et al. |
| 6,113,462 A | 9/2000 | Yang |
| 6,114,238 A | 9/2000 | Liao |
| 6,123,983 A * | 9/2000 | Smith et al. ............ 427/10 |
| 6,127,263 A | 10/2000 | Parikh |
| 6,128,016 A | 10/2000 | Coelho et al. |
| 6,136,163 A | 10/2000 | Cheung et al. |
| 6,141,660 A | 10/2000 | Bach et al. |
| 6,143,646 A | 11/2000 | Wetzel |
| 6,148,099 A | 11/2000 | Lee et al. |
| 6,148,239 A | 11/2000 | Funk et al. |
| 6,148,246 A | 11/2000 | Kawazome |
| 6,150,270 A | 11/2000 | Matsuda et al. |
| 6,157,864 A | 12/2000 | Schwenke et al. |
| 6,159,075 A | 12/2000 | Zhang |
| 6,159,644 A | 12/2000 | Satoh et al. |
| 6,161,054 A | 12/2000 | Rosenthal et al. |
| 6,169,931 B1 | 1/2001 | Runnels |
| 6,172,756 B1 | 1/2001 | Chalmers et al. |
| 6,173,240 B1 | 1/2001 | Sepulveda et al. |
| 6,175,777 B1 | 1/2001 | Kim |
| 6,178,390 B1 | 1/2001 | Jun |
| 6,181,013 B1 | 1/2001 | Liu et al. |
| 6,185,324 B1 | 2/2001 | Ishihara et al. |
| 6,191,864 B1 | 2/2001 | Sandhu |
| 6,192,291 B1 | 2/2001 | Kwon |
| 6,197,604 B1 | 3/2001 | Miller et al. |
| 6,201,208 B1 | 3/2001 | Wendt et al. |
| 6,204,165 B1 | 3/2001 | Ghoshal |
| 6,210,745 B1 * | 4/2001 | Gaughan et al. ............ 427/8 |
| 6,210,983 B1 | 4/2001 | Atchison et al. |
| 6,211,094 B1 | 4/2001 | Jun et al. |
| 6,212,961 B1 | 4/2001 | Dvir |
| 6,214,734 B1 | 4/2001 | Bothra et al. |
| 6,217,412 B1 | 4/2001 | Campbell et al. |
| 6,217,658 B1 | 4/2001 | Orczyk et al. |
| 6,219,711 B1 | 4/2001 | Chari |
| 6,222,936 B1 | 4/2001 | Phan et al. |
| 6,226,563 B1 | 5/2001 | Lim |
| 6,226,792 B1 | 5/2001 | Goiffon et al. |
| 6,228,280 B1 | 5/2001 | Li et al. |
| 6,230,069 B1 | 5/2001 | Campbell et al. |
| 6,232,236 B1 | 5/2001 | Shan et al. |
| 6,236,903 B1 | 5/2001 | Kim et al. |
| 6,237,050 B1 | 5/2001 | Kim et al. |
| 6,240,330 B1 | 5/2001 | Kurtzberg et al. |
| 6,240,331 B1 | 5/2001 | Yun |
| 6,245,581 B1 | 6/2001 | Bonser et al. |
| 6,246,972 B1 | 6/2001 | Klimasauskas |
| 6,248,602 B1 | 6/2001 | Bode et al. |
| 6,249,712 B1 | 6/2001 | Boiquaye |
| 6,252,412 B1 | 6/2001 | Talbot et al. |
| 6,259,160 B1 | 7/2001 | Lopatin et al. |
| 6,263,255 B1 | 7/2001 | Tan et al. |
| 6,268,270 B1 | 7/2001 | Scheid et al. |
| 6,271,670 B1 | 8/2001 | Caffey |
| 6,276,989 B1 | 8/2001 | Campbell et al. |
| 6,277,014 B1 | 8/2001 | Chen et al. |
| 6,278,899 B1 | 8/2001 | Piche et al. |
| 6,280,289 B1 | 8/2001 | Wiswesser et al. |
| 6,281,127 B1 | 8/2001 | Shue |
| 6,284,622 B1 | 9/2001 | Campbell et al. |
| 6,287,879 B1 | 9/2001 | Gonzales et al. |
| 6,290,572 B1 | 9/2001 | Hofmann |
| 6,291,367 B1 * | 9/2001 | Kelkar ............ 438/778 |
| 6,292,708 B1 | 9/2001 | Allen et al. |
| 6,298,274 B1 | 10/2001 | Inoue |
| 6,303,395 B1 | 10/2001 | Nulman |
| 6,304,999 B1 | 10/2001 | Toprac et al. |
| 6,307,628 B1 | 10/2001 | Lu et al. |
| 6,314,379 B1 | 11/2001 | Hu et al. |
| 6,317,643 B1 | 11/2001 | Dmochowski |
| 6,320,655 B1 | 11/2001 | Matsushita et al. |
| 6,324,481 B1 | 11/2001 | Atchison et al. |
| 6,334,807 B1 | 1/2002 | Lebel et al. |
| 6,336,841 B1 | 1/2002 | Chang |
| 6,339,727 B1 | 1/2002 | Ladd |
| 6,340,602 B1 | 1/2002 | Johnson et al. |
| 6,345,288 B1 | 2/2002 | Reed et al. |
| 6,345,315 B1 | 2/2002 | Mishra |
| 6,346,426 B1 | 2/2002 | Toprac et al. |
| 6,355,559 B1 | 3/2002 | Havemann et al. |
| 6,360,133 B1 | 3/2002 | Campbell et al. |
| 6,360,184 B1 | 3/2002 | Jacquez |
| 6,363,294 B1 | 3/2002 | Coronel et al. |
| 6,366,934 B1 | 4/2002 | Cheng et al. |
| 6,368,879 B1 | 4/2002 | Toprac |
| 6,368,883 B1 | 4/2002 | Bode et al. |
| 6,368,884 B1 | 4/2002 | Goodwin et al. |
| 6,379,980 B1 | 4/2002 | Toprac |
| 6,381,564 B1 | 4/2002 | David et al. |
| 6,388,253 B1 | 5/2002 | Su |
| 6,389,491 B1 | 5/2002 | Jacobson et al. |
| 6,391,780 B1 | 5/2002 | Shih et al. |
| 6,395,152 B1 | 5/2002 | Wang |
| 6,397,114 B1 | 5/2002 | Eryurek et al. |
| 6,400,162 B1 | 6/2002 | Mallory et al. |
| 6,405,096 B1 | 6/2002 | Toprac et al. |
| 6,405,144 B1 | 6/2002 | Toprac et al. |
| 6,417,014 B1 | 7/2002 | Lam et al. |
| 6,427,093 B1 | 7/2002 | Toprac |
| 6,432,728 B1 | 8/2002 | Tai et al. |
| 6,435,952 B1 | 8/2002 | Boyd et al. |
| 6,438,438 B1 | 8/2002 | Takagi et al. |
| 6,440,295 B1 | 8/2002 | Wang |
| 6,442,496 B1 | 8/2002 | Pasadyn et al. |
| 6,449,524 B1 | 9/2002 | Miller et al. |
| 6,455,415 B1 | 9/2002 | Lopatin et al. |
| 6,455,937 B1 | 9/2002 | Cunningham |
| 6,465,263 B1 | 10/2002 | Coss, Jr. et al. |
| 6,470,230 B1 | 10/2002 | Toprac et al. |
| 6,479,902 B1 | 11/2002 | Lopatin et al. |
| 6,479,990 B2 | 11/2002 | Mednikov et al. |
| 6,482,660 B2 | 11/2002 | Conchieri et al. |
| 6,484,064 B1 | 11/2002 | Campbell |
| 6,486,492 B1 | 11/2002 | Su |
| 6,492,281 B1 | 12/2002 | Song et al. |
| 6,495,452 B1 | 12/2002 | Shih |
| 6,503,839 B2 | 1/2003 | Gonzales et al. |
| 6,515,368 B1 | 2/2003 | Lopatin et al. |
| 6,517,413 B1 | 2/2003 | Hu et al. |
| 6,517,414 B1 | 2/2003 | Tobin et al. |
| 6,528,409 B1 | 3/2003 | Lopatin et al. |
| 6,529,789 B1 | 3/2003 | Campbell et al. |
| 6,532,555 B1 | 3/2003 | Miller et al. |
| 6,535,783 B1 | 3/2003 | Miller et al. |
| 6,537,912 B1 | 3/2003 | Agarwal |
| 6,540,591 B1 | 4/2003 | Pasadyn et al. |

| | | | | | | |
|---|---|---|---|---|---|---|
| 6,541,401 B1 * | 4/2003 | Herner et al. ............... 438/787 | EP | 0 895 145 A1 | 2/1999 | |
| 6,546,508 B1 | 4/2003 | Sonderman et al. | EP | 0 910 123 | 4/1999 | |
| 6,556,881 B1 | 4/2003 | Miller | EP | 0 932 194 | 7/1999 | |
| 6,560,504 B1 | 5/2003 | Goodwin et al. | EP | 0 932 195 A1 | 7/1999 | |
| 6,563,308 B2 | 5/2003 | Nagano et al. | EP | 1 067 757 | 1/2001 | |
| 6,567,717 B2 | 5/2003 | Krivokapic et al. | EP | 1 071 128 | 1/2001 | |
| 6,580,958 B1 | 6/2003 | Takano | EP | 1 083 470 A2 | 3/2001 | |
| 6,587,744 B1 | 7/2003 | Stoddard et al. | EP | 1072967 A3 | 11/2001 | |
| 6,590,179 B2 | 7/2003 | Tanaka et al. | GB | 2 347 885 A | 9/2000 | |
| 6,604,012 B1 | 8/2003 | Cho et al. | GB | 2 365 215 A | 2/2002 | |
| 6,605,549 B2 | 8/2003 | Leu et al. | JP | 61-66104 | 4/1986 | |
| 6,607,976 B2 | 8/2003 | Chen et al. | JP | 61-171147 | 8/1986 | |
| 6,609,946 B1 | 8/2003 | Tran | JP | 01-283934 | 11/1989 | |
| 6,616,513 B1 | 9/2003 | Osterheld | JP | 3-202710 | 9/1991 | |
| 6,618,692 B2 | 9/2003 | Takahashi et al. | JP | 05-151231 | 6/1993 | |
| 6,624,075 B1 | 9/2003 | Lopatin et al. | JP | 05-216896 | 8/1993 | |
| 6,625,497 B2 | 9/2003 | Fairbairn et al. | JP | 05-266029 | 10/1993 | |
| 6,630,741 B1 | 10/2003 | Lopatin et al. | JP | 06-110894 | 4/1994 | |
| 6,640,151 B1 | 10/2003 | Somekh et al. | JP | 06-176994 | 6/1994 | |
| 6,652,355 B2 | 11/2003 | Wiswesser et al. | JP | 06-184434 | 7/1994 | |
| 6,660,633 B1 | 12/2003 | Lopatin et al. | JP | 06-252236 | 9/1994 | |
| 6,678,570 B1 | 1/2004 | Pasadyn et al. | JP | 06-260380 | 9/1994 | |
| 6,708,074 B1 | 3/2004 | Chi et al. | JP | 8-23166 | 1/1996 | |
| 6,708,075 B2 | 3/2004 | Sonderman et al. | JP | 08-50161 | 2/1996 | |
| 6,725,402 B1 | 4/2004 | Coss, Jr. et al. | JP | 08-149583 | 6/1996 | |
| 6,728,587 B2 | 4/2004 | Goldman et al. | JP | 08-304023 | 11/1996 | |
| 6,735,492 B2 | 5/2004 | Conrad et al. | JP | 09-34535 | 2/1997 | |
| 6,751,518 B1 | 6/2004 | Sonderman et al. | JP | 9-246547 | 9/1997 | |
| 6,774,998 B1 | 8/2004 | Wright et al. | JP | 10-34522 | 2/1998 | |
| 6,913,938 B2 * | 7/2005 | Shanmugasundram et al. ........................ 438/16 | JP | 10-173029 | 6/1998 | |
| 2001/0001755 A1 | 5/2001 | Sandhu et al. | JP | 11-67853 | 3/1999 | |
| 2001/0003084 A1 | 6/2001 | Finarov | JP | 11-126816 | 5/1999 | |
| 2001/0006873 A1 | 7/2001 | Moore | JP | 11-135601 | 5/1999 | |
| 2001/0030366 A1 | 10/2001 | Nakano et al. | JP | 2001-76982 | 3/2001 | |
| 2001/0039462 A1 | 11/2001 | Mendez et al. | JP | 2001-284299 | 10/2001 | |
| 2001/0040997 A1 | 11/2001 | Tsap et al. | JP | 2001-305108 | 10/2001 | |
| 2001/0042690 A1 | 11/2001 | Talieh | JP | 2002-9030 | 1/2002 | |
| 2001/0044667 A1 | 11/2001 | Nakano et al. | JP | 2002-343754 | 11/2002 | |
| 2002/0032499 A1 | 3/2002 | Wilson et al. | TW | 434103 | 5/2001 | |
| 2002/0058460 A1 | 5/2002 | Lee et al. | TW | 436383 | 5/2001 | |
| 2002/0070126 A1 | 6/2002 | Sato et al. | TW | 455938 | 9/2001 | |
| 2002/0077031 A1 | 6/2002 | Johansson et al. | TW | 455976 | 9/2001 | |
| 2002/0081951 A1 | 6/2002 | Boyd et al. | WO | WO 98/05066 | 2/1998 | |
| 2002/0089676 A1 | 7/2002 | Pecen et al. | WO | WO 99/09371 | 2/1999 | |
| 2002/0102853 A1 | 8/2002 | Li et al. | WO | WO 99/59200 | 11/1999 | |
| 2002/0107599 A1 | 8/2002 | Patel et al. | WO | WO 00/05759 | 2/2000 | |
| 2002/0107604 A1 | 8/2002 | Riley et al. | WO | WO 00/35063 | 6/2000 | |
| 2002/0113039 A1 | 8/2002 | Mok et al. | WO | WO 00/79355 A1 | 12/2000 | |
| 2002/0127950 A1 | 9/2002 | Hirose et al. | WO | WO 01/11679 | 2/2001 | |
| 2002/0128805 A1 | 9/2002 | Goldman et al. | WO | WO 01/15865 A1 | 3/2001 | |
| 2002/0149359 A1 | 10/2002 | Crouzen et al. | WO | WO 01/18623 | 3/2001 | |
| 2002/0165636 A1 | 11/2002 | Hasan | WO | WO 01/25865 | 4/2001 | |
| 2002/0183986 A1 | 12/2002 | Stewart et al. | WO | WO 01/33277 | 5/2001 | |
| 2002/0185658 A1 | 12/2002 | Inoue et al. | WO | WO 01/33501 A1 | 5/2001 | |
| 2002/0193899 A1 | 12/2002 | Shanmugasundram et al. | WO | WO 01/52319 | 7/2001 | |
| 2002/0193902 A1 | 12/2002 | Shanmugasundram et al. | WO | WO 01/080306 | 10/2001 | |
| 2002/0197745 A1 | 12/2002 | Shanmugasundram et al. | WO | WO 02/31613 A2 | 4/2002 | |
| 2002/0197934 A1 | 12/2002 | Paik | WO | WO 02/31613 A3 | 4/2002 | |
| 2002/0199082 A1 | 12/2002 | Shanmugasundram et al. | WO | WO 02/074491 | 9/2002 | |
| 2003/0017256 A1 | 1/2003 | Shimane | | | | |
| 2003/0020909 A1 | 1/2003 | Adams et al. | | | | |
| 2003/0020928 A1 | 1/2003 | Ritzdorf et al. | | | | |
| 2003/0154062 A1 | 8/2003 | Daft et al. | | | | |

FOREIGN PATENT DOCUMENTS

| | | |
|---|---|---|
| CA | 2165847 | 8/1991 |
| CA | 2194855 | 8/1991 |
| EP | 0 397 924 A1 | 11/1990 |
| EP | 0 621 522 A2 | 10/1994 |
| EP | 0 869 652 | 10/1998 |
| EP | 0 877 308 A2 | 11/1998 |

OTHER PUBLICATIONS

Kim, Eui Jung et al., "Analytical Model for Chemical Vapor Deposition of SiO2 films using tetraethoxysilane and ozone." Journal of Crystal Growth, vol. 140, Issues 3-4, Jul. 1994, pp. 315-326. *Abstract Only*.*

Jul. 23, 2002. Communication Pursuant to Article 96(2) EPC for European Patent Application No. 00 115 577.9.

Oct. 15, 2002. International Search Report prepared by the European Patent Office for PCT/US02/19062.

Ostanin, Yu.Ya. Oct. 1981. "Optimization of Thickness Inspection of Electrically Conductive Single-Layer Coatings with Laid-on Eddy-Current Transducers (Abstract)." *Defektoskopiya*, vol. 17, No. 10, pp. 45-52. Moscow, USSR.

Feb. 1984. "Substrate Screening Process." *IBM Technical Disclosure Bulletin*, pp. 4824-4825.

Herrmann, D. 1988. "Temperature Errors and Ways of Elimination for Contactless Measurement of Shaft Vibrations (Abstract)." *Technisches Messen™*, vol. 55, No. 1, pp. 27-30. West Germany.

Lin, Kuang-Kuo and Costas J. Spanos. Nov. 1990. "Statistical Equipment Modeling for VLSI Manufacturing: An Application for LPCVD." *IEEE Transaction on Semiconductor Manufacturing*, v. 3, n. 4, pp. 216-229.

Chang, Norman H. and Costas J. Spanos. Feb. 1991. "Continuous Equipment Diagnosis Using Evidence Integration: An LPCVD Application." *IEEE Transactions on Semiconductor Manufacturing*, v. 4, n. 1, pp. 43-51.

Larrabee, G. B. May 1991. "The Intelligent Microelectronics Factory of the Future (Abstract)." *IEEE/SEMI International Semiconductor Manufacturing Science Symposium*, pp. 30-34. Burlingame, CA.

Burke, Peter A. Jun. 1991. "Semi-Empirical Modelling of SiO2 Chemical-Mechanical Polishing Planarization." *VMIC Conference, 1991 IEEE*, pp. 379-384. IEEE.

May 1992. "Laser Ablation Endpoint Detector." *IBM Technical Disclosure Bulletin*, pp. 333-334.

Spanos, Costas J., Hai-Fang Guo, Alan Miller, and Joanne Levine-Parrill. Nov. 1992. "Real-Time Statistical Process Control Using Tool Data." *IEEE Transactions on Semiconductor Manufacturing*, v. 5, n. 4, pp. 308-318.

Scarr, J. M. and J. K. Zelisse. Apr. 1993. "New Topology for Thickness Monitoring Eddy Current Sensors (Abstract)." *Proceedings of the 36th Annual Technical Conference*, Dallas, Texas, no page numbers.

Matsuyama, Akira and Jess Niou. 1993. "A State-of-the-Art Automation System of an ASIC Wafer Fab in Japan." *IEEE/SEMI International Semiconductor Manufacturing Science Symposium*, pp. 42-47.

Yeh, C. Eugene, John C. Cheng, and Kwan Wong. 1993. "Implementation Challenges of a Feedback Control System for Wafer Fabrication." *IEEE/CHMT International Electronics Manufacturing Technology Symposium*, pp. 438-442.

Kurtzberg, Jerome M. and Menachem Levanoni. Jan. 1994. "ABC: A Better Control for Manufacturing." *IBM Journal of Research and Development*, v. 38, n. 1, pp. 11-30.

Mozumder, Purnendu K. and Gabriel G. Barna. Feb. 1994. "Statistical Feedback Control of a Plasma Etch Process." *IEEE Transactions on Semiconductor Manufacturing*, v. 7, n. 1, pp. 1-11.

Muller-Heinzerling, Thomas, Ulrich Neu, Hans Georg Nurnberg, and Wolfgang May. Mar. 1994. "Recipe-Controlled Operation of Batch Processes with Batch X." *ATP Automatisierungstechnische Praxis*, vol. 36, No. 3, pp. 43-51.

Stoddard, K., P. Crouch, M. Kozicki, and K. Tsakalis. Jun.-Jul. 1994. "Application of Feedforward and Adaptive Feedback Control to Semiconductor Device Manufacturing (Abstract)." *Proceedings of 1994 American Control Conference—ACC '94*, vol. 1, pp. 892-896. Baltimore, Maryland.

Schaper, C. D., M. M. Moslehi, K. C. Saraswat, and T. Kailath. Nov. 1994. "Modeling, Identification, and Control of Rapid Thermal Processing Systems (Abstract)." *Journal of the Electrochemical Society*, vol. 141, No. 11, pp. 3200-3209.

Tao, K. M., R. L. Kosut, M. Ekblad, and G. Aral. Dec. 1994. "Feedforward Learning Applied to RTP of Semiconductor Wafers (Abstract)." *Proceedings of the 33rd IEEE Conference on Decision and Control*, vol. 1, pp. 67-72. Lake Buena Vista, Florida.

Hu, Albert, He Du, Steve Wong, Peter Renteln, and Emmanuel Sachs. 1994. "Application of Run by Run Controller to the Chemical-Mechanical Planarization Process." *IEEE/CPMT International Electronics Manufacturing Technology Symposium*, pp. 371-378.

Spanos, C. J., S. Leang, S.-Y. Ma, J. Thomson, B. Bombay, and X. Niu. May 1995. "A Multistep Supervisory Controller for Photolithographic Operations (Abstract)." *Proceedings of the Symposium on Process Control, Diagnostics, and Modeling in Semiconductor Manufacturing*, pp. 3-17.

Leang, Sovarong, Shang-Yi Ma, John Thomson, Bart John Bombay, and Costas J. Spanos. May 1996. "A Control System for Photolithographic Sequences." *IEEE Transactions on Semiconductor Manufacturing*, vol. 9, No. 2, no page numbers.

Boning, Duane S., William P. Moyne, Taber H. Smith, James Moyne, Ronald Telfeyan, Arnon Hurwitz, Scott Shellman, and John Taylor. Oct. 1996. "Run by Run Control of Chemical-Mechanical Polishing." *IEEE Transactions on Components, Packaging, and Manufacturing Technology—Part C*, vol. 19, No. 4, pp. 307-314.

Zhe, Ning, J. R. Moyne, T. Smith, D. Boning, E. Del Castillo, Yeh Jinn-Yi, and Hurwitz. Nov. 1996. "A Comparative Analysis of Run-to-Run Control Algorithms in Semiconductor Manufacturing Industry (Abstract)." *IEEE/SEMI 1996 Advanced Semiconductor Manufacturing Conference Workshop*, pp. 375-381.

Yasuda, M., T. Osaka, and M. Ikeda. Dec. 1996. "Feedforward Control of a Vibration Isolation System for Disturbance Suppression (Abstract)." *Proceeding of the 35th IEEE Conference on Decision and Control*, vol. 2, pp. 1229-1233. Kobe, Japan.

Fan, Jr-Min, Ruey-Shan Guo, Shi-Chung Chang, and Kian-Huei Lee. 1996. "Abnormal Tred Detection of Sequence-Disordered Data Using EWMA Method." *IEEE/SEMI Advanced Semiconductor Manufacturing Conference*, pp. 169-174.

Smith, Taber and Duane Boning. 1996. "A Self-Tuning EWMA Controller Utilizing Artificial Neural Network Function Approximation Techniques." *IEEE/CPMT International Electronics Manufacturing Technology Symposium*, pp. 355-363.

Guo, Ruey-Shan, Li-Shia Huang, Argon Chen, and Jin-Jung Chen. Oct. 1997. "A Cost-Effective Methodology for a Run-by-Run EWMA Controller." *6th International Symposium on Semiconductor Manufacturing*, pp. 61-64.

Mullins, J. A., W. J. Campbell, and A. D. Stock. Oct. 1997. "An Evaluation of Model Predictive Control in Run-to-Run Processing in Semiconductor Manufacturing (Abstract)." *Proceedings of the SPIE—The International Society for Optical Engineering Conference*, vol. 3213, pp. 182-189.

Reitman, E. A., D. J. Friedman, and E. R. Lory. Nov. 1997. "Pre-Production Results Demonstrating Multiple-System Models for Yield Analysis (Abstract)." *IEEE Transactions on Semiconductor Manufacturing*, vol. 10, No. 4, pp. 469-481.

Durham, Jim and Myriam Roussel. 1997. "A Statistical Method for Correlating In-Line Defectivity to Probe Yield." *IEEE/SEMI Advanced Semiconductor Manufacturing Conference*, pp. 76-77.

Shindo, Wataru, Eric H. Wang, Ram Akella, and Andrzej J. Strojwa. 1997. "Excursion Detection and Source Isolation in Defect Inspection and Classification." *2nd International Workshop on Statistical Metrology*, pp. 90-93.

Jul. 1998. "Active Controller: Utilizing Active Databases for Implementing Multistep Control of Semiconductor Manufacturing (Abstract)." *IEEE Transactions on Components, Packaging and Manufacturing Technology—Part C*, vol. 21, No. 3, pp. 217-224.

Fang, S. J., A. Barda, T. Janecko, W. Little, D. Outley, G. Hempel, S. Joshi, B. Morrison, G. B. Shinn, and M. Birang. 1998. "Control of Dielectric Chemical Mechanical Polishing (CMP) Using and Interferometry Based Endpoint Sensor." *International Proceedings of the IEEE Interconnect Technology Conference*, pp. 76-78.

Ouma, Dennis, Duane Boning, James Chung, Greg Shinn, Leif Olsen, and John Clark. 1998. "An Integrated Characterization and Modeling Methodology for CMP Dielectric Planarization." *Proceedings of the IEEE 1998 International Interconnect Technology Conference*, pp. 67-79.

Boning, Duane S., Jerry Stefani, and Stephanie W. Butler. Feb. 1999. "Statistical Methods for Semiconductor Manufacturing." *Encyclopedia of Electrical Engineering*, J. G. Webster, Ed, no page numbers.

McIntosh John. Mar. 1999. "Using CD-SEM Metrology in the Manufacture of Semiconductors (Abstract)." *JOM*, vol. 51, No. 3, pp. 38-39.

Pan, J. Tony, Ping Li, Kapila Wijekoon, Stan Tsai, and Fritz Redeker. May 1999. "Copper CMP Integration and Time Dependent Pattern Effect." *IEEE 1999 International Interconnect Technology Conference*, pp. 164-166.

Meckl, P. H. and K. Umemoto. Aug. 1999. "Achieving Fast Motions in Semiconductor Manufacturing Machinery (Abstract)." *Proceedings of the 1999 IEEE International Conference on Control Applications*, vol. 1, pp. 725-729. Kohala Coast, HI.

Khan, K., C. El Chemali, J. Moyne, J. Chapple-Sokol, R. Nadeau, P. Smith, C., and T. Parikh. Oct. 1999. "Yield Improvement at the Contact Process Through Run-To-Run Control (Abstract)." *24th IEEE/CPMT Electronics Manufacturing Technology Symposium*, pp. 258-263.

Ruegsegger, Steven, Aaron Wagner, James S. Freudenberg, and Dennis S. Grimard. Nov. 1999. "Feedforward Control for Reduced Run-to-Run Variation in Microelectronics Manufacturing." *IEEE Transactions on Semiconductor Manufacturing*, vol. 12, No. 4, no page numbers.

Edgard, T. F., W. J. Campbell, and C. Bode. Dec. 1999. "Model-Based Control in Microelectronics Manufacturing." *Proceedings of the 38th IEEE Conference on Decision and Control*, Phoenix, Arizona, vol. 4, pp. 4185-4191.

Meckl, P. H. and K. Umemoto. Apr. 2000. "Achieving Fast Motions by Using Shaped Reference Inputs [Semiconductor Manufacturing Machine] (Abstract)." *NEC Research and Development*, vol. 41, No. 2, pp. 232-237.

Oeschsner, R., T. Tschaftary, S. Sommer, L. Pfitzner, H. Ryssel, H. Gerath, C. Baier, and M. Hafner. Sep. 2000. -"Feed-forward Control for a Lithography/Etch Sequence (Abstract)." *Proceedings of the SPIE—The International Society for Optical Engineering Conference*, vol. 4182, pp. 31-39.

Cheung, Robin. Oct. 18, 2000. "Copper Interconnect Technology." *AVS/CMP User Group Meeting*, Santa Clara, CA, no page numbers.

Edgar, Thomas F., Stephanie W. Butler, Jarrett Campbell, Carlos Pfeiffer, Christopher Bode, Sung Bo Hwang, K. S. Balakrishnan, and J. Hahn. Nov. 2000. "Automatic Control in Microelectronics Manufacturing: Practices, Challenges, and Possibilities (Abstract)." *Automatica*, v. 36, n. 11, no page numbers.

Khan, S., M. Musavi, and H. Ressom. Nov. 2000. "Critical Dimension Control in Semiconductor Manufacturing (Abstract)." *ANNIE 2000. Smart Engineering Systems Design Conference*, pp. 995-1000. St. Louis, Missouri.

Ravid, Avi, Avner Sharon, Amit Weingarten, Vladimir Machavariani, and David Scheiner. 2000. "Copper CMP Planarity Control Using ITM." *IEEE/SEMI Advanced Semiconductor Manufacturing Conference*, pp. 437-443.

Chen, Argon and Ruey-Shan Guo. Feb. 2001. "Age-Based Double EWMA Controller and Its Application to CMP Processes." *IEEE Transaction on Semiconductor Manufacturing*, vol. 14, No. 1, pp. 11-19.

Tobin, K. W., T. P. Karnowski, L. F. Arrowood, and F. Lakhani. Apr. 2001. "Field Test Results of an Automated Image Retrieval System (Abstract)." *Advanced Semiconductor Manufacturing Conference, 2001 IEEE/SEMI*, Munich, Germany, no page numbers.

Tan, K. K., H. F. Dou, and K. Z. Tang. May-Jun. 2001. "Precision Motion Control System for Ultra-Precision Semiconductor and Electronic Components Manufacturing (Abstract)." *51st Electronic Components and Technology Conference 2001. Proceedings*, pp. 1372-1379. Orlando, Florida.

Heuberger, U. Sep. 2001. "Coating Thickness Measurement with Dual-Function Eddy-Current & Magnetic Inductance Instrument (Abstract)." *Galvanotechnik*, vol. 92, No. 9, pp. 2354-2366+IV.

Wang, LiRen and Hefin Rowlands. 2001. "A Novel NN-Fuzzy-SPC Feedback Control System." *8th IEEE International Conference on Emerging Technologies and Factory Automation*, pp. 417-423.

Moyne, J., V. Solakhian, A. Yershov, M. Anderson, and D. Mockler-Hebert. Apr.-May 2002. "Development and Deployment of a Multi-Component Advanced Process Control System for an Epitaxy Tool (Abstract)." *2002 IEEE Advanced Semiconductor Manufacturing Conference and Workshop*, pp. 125-130.

Sarfaty, M., A. Shanmugasundram, A. Schwarm, J. Paik, Jimin Zhang, Rong Pan, M. J. Seamons, H. Li, R. Hung, and S. Parikh. Apr.-May 2002. "Advance Process Control Solutions for Semiconductor Manufacturing (Abstract)." *13th Annual IEEE/SEMI Advanced Semiconductor Manufacturing Conference. Advancing the Science and Technology of Semiconductor Manufacturing. ASMC 2002*, pp. 101-106. Boston, MA.

Campbell, W. J., S. K. Firth, A. K. Toprac, and T. F. Edgar. May 2002. "A Comparison of Run-to-Run Control Algorithms (Abstract)." *Proceedings of 2002 American Control Conference*, vol. 3, pp. 2150-2155.

Good, Richard and S. Joe Qin. May 2002. "Stability Analysis of Double EWMA Run-to-Run Control with Metrology Delay." *IEEE/CPMT International Electronics Manufacturing Technology Symposium*, pp. 355-363.

Smith, Stewart, Anthony J. Walton, Alan W. S. Ross, Georg K. H. Bodammer, and J. T. M. Stevenson. May 2002. "Evaluation of Sheet Resistance and Electrical Linewidth Measurement Techniques for Copper Damascene Interconnect." *IEEE Transactions on Semiconductor Manufacturing*, vol. 15, No. 2, pp. 214-222.

Itabashi, Takeyuki, Hiroshi Nakano, and Haruo Akahoshi. Jun. 2002. "Electroless Deposited CoWB for Copper Diffusion Barrier Metal." *IEEE International Interconnect Technology Conference*, pp. 285-287.

Takahashi, Shingo, Kaori Tai, Hiizu Ohtorii, Naoki Komai, Yuji Segawa, Hiroshi Horikoshi, Zenya Yasuda, Hiroshi Yamada, Masao Ishihara, and Takeshi Nogami. 2002. "Fragile Porous Low-k/Copper Integration by Using Electro-Chemical Polishing." *2002 Symposium on VLSI Technology Digest of Technical Papers*, pp. 32-33.

Adams, Bret W., Bogdan Swedek, Rajeev Bajaj, Fritz Redeker, Manush Birang, and Gregory Amico. "Full-Wafer Endpoint Detection Improves Process Control in Copper CMP." *Semiconductor Fabtech*—12th Edition. Applied Materials, Inc., Santa Clara, CA, no date.

Berman, Mike, Thomas Bibby, and Alan Smith. "Review of In Situ & In-line Detection for CMP Applications." *Semiconductor Fabtech*, 8th Edition, pp. 267-274, no date.

Levine, Martin D. 1985. *Vision in Man and Machine*. New York: McGraw-Hill, Inc. pp. ix-xii, 1-58.

Pilu, Maurizio. Sep. 2001. "Undoing Page Curl Distortion Using Applicable Surfaces." *IEEE International Conferencec on Image Processing*. Thessalonica, Greece, no page numbers.

May 23, 2003. Written Opinion for PCT/US01/24910.

Williams, Randy, Dali Gudmundsson, Kevin Monahan, Raman Nurani, Meryl Stoller and J. George Shanthikumar. Oct. 1999. "Optimized Sample Planning for Wafer Defect Inspection," *Semiconductor Manufaturing Conference Proceedings, 1999 IEEE International Symposium on Santa Clara, CA*. Piscataway, NJ. pp. 43-46.

Jul. 23, 2003. Invitation to Pay Additional Fees and Communication Relating to the Results of the Partial International Search for PCT/US02/19116.

Aug. 1, 2003. Written Opinion for PCT/US01/27406.

Aug. 20, 2003. Written Opinion for PCT/US01/22833.

Miller, G. L., D. A. H. Robinson, and J. D. Wiley. Jul. 1976. "Contactless measurement of semiconductor conductivity by radio frequency-free-carrier power absorption." *Rev. Sci. Instrum.*, vol. 47, No. 7, pp. 799-805.

El Chemali, Chadi et al. Jul./Aug. 2000. "Multizone uniformity control of a chemical mechanical polishing process utilizing a pre- and postmeasurement strategy." *J. Vac. Sci. Technol.* vol. 18, No. 4. pp. 1287-1296.

Aug. 8, 2003. PCT International Search Report form PCT/US03/08513.

Oct. 14, 2003. PCT International Search Report from PCT/US02/21942.

Oct. 20, 2003. PCT International Search Report from PCT/US02/19116.

Oct. 23, 2003. PCT International Preliminary Examination Report from PCT/US01/24910.

Rocha, Joao and Carlos Ramos. Sep. 12, 1994. "Task Planning for Flexible and Agile Manufacturing Systems." *Intelligent Robots and Systems '94. Advanced Robotic Systems and the Real World, IROS '94. Proceedings of the IEEE/RSJ/GI International Conference on Munich, Germany Sep. 12-16, 1994*. New York, New York: IEEE. pp. 105-112.

Sun, S.C. 1998. "CVD and PVD Transition Metal Nitrides as Diffusion Barriers for Cu Metallization." *IEEE*. pp. 243-246.

Tagami, M., A. Fuyura, T. Onodera, and Y. Hayashi. 1999. "Layered Ta-nitrides (LTN) Barrier Film by Power Swing Sputtering (PSS) Technique for MOCVD-Cu Damascene Interconnects." *IEEE*. pp. 635-638.

Yamagishi, H., Z. Tokei, G.P. Beyer, R. Donaton, H. Bender, T. Nogami, and K. Maex. 2000. "TEM/SEM Investigation and Electrical Evaluation of a Bottomless I-PVD TA(N) Barrier in Dual Damascene" (Abstract). *Advanced Metallization Conference 2000*. San Diego, CA.

Eisenbraun, Eric, Oscar van der Straten, Yu Zhu, Katharine Dovidenko, and Alain Kaloyeros. 2001. "Atomic Layer Deposition (ALD) of Tantalum-Based Materials for Zero Thickness Copper Barrier Applications" (Abstract). *IEEE*. pp. 207-209.

Smith, S.R., K.E. Elers, T. Jacobs, V. Blaschke, and K. Pfeifer. 2001. "Physical and Electrical Characterization of ALD Tin Used as a Copper Diffusion Barrier in 0.25 mum, Dual Damascene Backend Structures" (Abstract). *Advanced Metallization Conference 2001*. Montreal, Quebec.

Kim, Y.T. and H. Sim. 2002. "Characteristics of Pulse Plasma Enhanced Atomic Layer Deposition of Tungsten Nitride Diffusion Barrier for Copper Interconnect" (Abstract). *IEIC Technical Report*. vol. 102, No. 178, pp. 115-118.

Elers, Kai-Erik, Ville Saanila, Pekka J. Soininen, Wei-Min Li, Juhana T. Kostamo, Suvi Haukka, Jyrki Juhanoja, and Wim F.A. Besling. 2002. "Diffusion Barrier Deposition on a Copper Surface by Atomic Layer Deposition" (Abstract). *Advanced Materials*. vol. 14, No. 13-14, pp. 149-153.

Peng, C.H., C.H. Hsieh, C.L. Huang, J.C. Lin, M.H. Tsai, M.W. Lin, C.L. Chang, Winston S. Shue, and M.S. Liang. 2002. "A 90nm Generation Copper Dual Damascene Technology with ALD TaN Barrier." *IEEE*. pp. 603-606.

Van der Straten, O., Y. Zhu, E. Eisenbraun, and A. Kaloyeros. 2002. "Thermal and Electrical Barrier Performance Testing of Ultrathin Atomic Layer Deposition Tantalum-Based Materials for Nanoscale Copper Metallization." *IEEE*. pp. 188-190.

Wu, Z.C., Y.C. Lu, C.C. Chiang, M.C. Chen, B.T. Chen, G.J. Wang, Y.T. Chen, J.L. Huang, S.M. Jang, and M.S. Liang. 2002. "Advanced Metal Barrier Free Cu Damascene Interconnects with PECVD Silicon Carbide Barriers for 90/65-nm BEOL Technology." *IEEE*. pp. 595-598.

Guo, R.S, A. Chen, C.L. Tseng, I.K. Fong, A. Yang, C.L. Lee, C.H. Wu, S. Lin, S.J. Huang, Y.C. Lee, S.G. Chang, and M.Y. Lee. Jun. 16-17, 1998. "A Real-Time Equipment Monitoring and Fault Detection System." *Semiconductor Manufacturing Technology Workshop*, pp. 111-121.

Lantz, Mikkel. 1999. "Equipment and APC Integration at AMD with Workstream." *IEEE*, pp. 325-327.

Jiyoun Kim, James Moyne, Chadi El Chemali, Rick Nadeau, Paul Smith, John Colt, Jonathan Chapple-Sokol, and Tarun Parikh. "Gradient and Radial Uniformity Control of a CMP Process Utilizing a Pre- and Post- Measurement Strategy.", no publication, date, pgs.

Shahid Rauf, and Mark K. Kushner. "Virtual Plasma Equipment Model: A Tool for Investigating Feedback Control in Plasma Processing Equipment." *IEEE*, pp. 486-494, Aug. 1998.

Shahid Raul, and Mark J. Kushner. "Controller design issues in the feedback control of radio frequency plasma processing reactors." *American Vacuum Society*, pp. 704-712, J Vac Sci Technol A 17(3). May/Jun. 1999.

Dishon, G., D. Eylon, M. Finarov, and A. Shulman. "Dielectric CMP Advanced Process Control Based on Integrated Monitoring." Ltd. Rehoveth, Israel: Nova Measuring Instruments, no date or page numbers.

Feb. 1984. "Method and Apparatus of in Situ Measurement and Overlay Error Analysis for Correcting Step and Repeat Lithographic Cameras." *IBM Technical Disclosure Bulletin*, pp. 4855-4859.

Oct. 1984. "Method to Characterize the Stability of a Step and Repeat Lithographic System." *IBM Technical Disclosure Bulletin*, pp. 2857-2860.

Runyan, W. R., and K. E. Bean. 1990. "Semiconductor Integrated Circuit Processing Technology." p. 48. Reading, Massachusetts: Addison-Wesley Publishing Company.

Zorich, Robert. 1991. *Handbook of Quality Integrated Circuit Manufacturing*, pp. 464-498 San Diego, California: Academic Press, Inc.

Rampalli, Prasad, Arakere Ramesh, and Nimish Shah. 1991. *CEPT—A Computer-Aided Manufacturing Application for Managing Equipment Reliability and Availability in the Semiconductor Industry*. New York, New York: IEEE, no page numbers.

Moyne, James R., Nauman Chaudhry, and Roland Telfeyan. 1995. "Adaptive Extensions to a Multi-Branch Run-to-Run Controller for Plasma Etching." *Journal of Vacuum Science and Tenchology*. Ann Arbor, Michigan Univeristy of Michigan Display Technology Manufacturing Center, no page numbers.

Moyne, James, Roland Telfeyan, Arnon Hurwitz, and John Taylor. Aug. 1995. "A Process-Independent Run-to-Run Controller and Its Application to Chemical-Mechanical Planarization." *SEMI/IEEE Advanced Semiconductor Manufacturing Conference and Workshop*. Ann Arbor, Michigan: The University of Michigan, Electrical Engineering & Computer Science Center for Display Technology & Manufacturing, no page numbers.

Zhou, Zhen-Hong and Rafael Reif. Aug. 1995. "Epi-Film Thickness Measurements Using Emission Fourier Transform Infrared Spectroscopy—Part II: Real-Time *in Situ* Process Monitoring and Control." IEEE Transactions on Semiconductor Manufacturing, vol. 8, No. 3, no page numbers.

Telfeyan, Roland, James Moynes, Nauman Chaudry, James Pugmire, Scott Shellman, Duane Boning, William Moyne, Arnon Hurwitz, and John Taylor. Oct. 1995. "A Mutli-Level Approach to the Control of a Chemical-Mechanical Planarization Process." Minneapolis, Minnesota: 42$^{nd}$ National Symposium of the American Vacuum Society, no page numbers.

Chang, E., B. Stine, T. Maung, R. Divecha, D. Boning, J. Chung, K. Chang, G. Ray, D. Bradbury, O. S. Nakagawa, S. Oh, and D. Bartelink. Dec. 1995. "Using a Statistical Metrology Framework to Identify Systematic and Random Sources of Die- and Wafer-level ILD Thickness Variation in CMP Processes." Washington, D.C.: International Electron Devices Meeting, no page numbers.

Schmid, Hans Albrecht. 1995. "Creating the Architecture of a Manufacturing Framework by Design Patterns." Austin, Texas: OOPSLA, no page numbers.

Dishon, G., M. Finarov, R. Kipper, J.W. Curry, T. Schraub, D. Trojan, 4$^{th}$ Starnbaugh, Y. Li and J Ben-Jacob. Feb. 1996. "On-Line Integrated Metrology for CMP Processing." Santa Clara, California: VMIC Speciality Conferences, 1$^{st}$ International CMP Planarization Conference, no page numbers.

Smith, Taber, Duane Boning, James Moyne, Arnon Hurwitz, and John Curry. Jun. 1996. "Compensating for CMP Pad Wear Using Run by Run Feedback Control." Santa Clara, California: VLSI Multilevel Interconnect Conference, no page numbers.

Boning, Duane, William Moyne, Taber Smith, James Moyne, Roland Telfeyan, Arnon Hurwitz, Scott Shellman, and John Taylor. Oct. 1996. "Run by Run Control of Chemical-Mechanical Polishing." *IEEE Trans. CPMT (C)*, vol. 19, No. 4, pp. 307-314.

SEMI. [1986] 1996. "Standard for Definition and Measurement of Equipment Reliability, Availability, and Maintainability (RAM)." SEMI E10-96, no page numbers.

Van Zant, Peter. 1997. *Microchip Fabrication: A Practical Guide to Semiconductor Processing*. Third Edition, pp. 471-478. New York, New York: McGraw-Hill.

Campbell, W. Jarrett, and Anthony J. Toprac. Feb. 11-12, 1998. "Run-to-Run Control in Microelectronics Manufacturing." Advanced Micro Devises, TWMCC, no page numbers.

Edgar, Thomas F., Stephanie W. Butler, Jarrett Campbell, Carlos Pfeiffer, Chris Bode, Sung Bo Hwang, and K.S. Balakrishnan. May 1998. "Automatic Control in Microelectronics Manufacturing: Practices, Challenges, and Possibilities." Automatica, vol. 36, pp. 1567-1603, 2000.

Moyne, James, and John Curry. Jun. 1998. "A Fully Automated Chemical-Mechanical Planarization Process." Santa Clara, California: VLSI Multilevel Interconnection (V-MIC) Conference, no page numbers.

SEMI. Jul. 1998. *New Standard: Provisional Specification for CIM Framework Domain Architecture*. Mountain View, California: SEMI Standards. SEMI Draft Doc. 2817.

Consilium. Aug. 1998. *Quality Management Component: QMC™ and QMC-Link™ Overview*. Mountain View, California: Consilium, Inc, no page numbers.

Chemali, Chadi El, James Moyne, Kareemullah Khan, Rock Nadeau, Paul Smith, John Colt, Jonathan Chapple-Sokol, and Tarun Parikh. Nov. 1998. "Multizone Uniformity Control of a CMP Process Utilizing a Pre and Post-Measurement Strategy." Seattle, Washington: SEMETECH Symposium, no page numbers.

Consilium. 1998. *FAB300™*. Mountain View, California: Consilium, Inc, no page numbers.

Khan, Kareemullah, Victor Solakhain, Anthony Ricii, Tier Gu, and James Moyne. 1998. "Run-to-Run Control of ITO Deposition Process." Ann Arbor, Michigan, no page numbers.

Consilium. Jan. 1999. "FAB300™: Consilium's Next Generation MES Solution of Software and Services which Control and Automate Real-Time FAB Operations." www.consilium.com/products/fab300_page.htm#FAB300 Introduction, no page numbers.

Baliga, John. Jul. 1999. "Advanced Process Control: Soon to be a Must." Cahners Semiconductor International. www.semiconductor.net/semiconductor/issues/issues/1999/jul99/docs/feature1.asp, no page numbers.

Consilium. Jul. 1999. "Increasing Overall Equipment Effectiveness (OEE) in Fab Manufacturing by Implementing Consilium's Next-Generation Manufacturing Execution System—MES II." Semiconductor Fabtech Edition 10, no page numbers.

Consilium Corporate Brochure. Oct. 1999. www.consilium.com, no page numbers.

Moyne, James. Oct. 1999. "Advancements in CMP Process Automation and Control." Hawaii: (Invited paper and presentation to) Third International Symposium on Chemical Mechanical Polishing in IC Devicce Manufacturing: 196th Meeting of the Electrochemical Society, no page numbers.

Consilium. Nov. 1999. *FAB300™ Update*, no page numbers.

SEMI. 2000. "Provisional Specification for CIM Framework Scheduling Component." San Jose, California. SEMI E105-1000, no page numbers.

Lee, Brian, Duane S. Boning, Winthrop Baylies, Noel Poduje, Pat Hester, Yorig Xia, John Valley, Chris Koliopoulus, Dale Hetherington, HongJiang Sun, and Michael Lacy. Apr. 2001. "Wafer Nanotopography Effects on CMP: Experimental Validation of Modeling Methods." San Francisco, California: Materials Research Society Spring Meeting, no page numbers.

Jul. 5, 2001. "Motorola and Advanced Micro Devices Buy ObjectSpace Catalyst Advanced Process Control Product for Five Wafer Fabs." Semiconductor FABTECH. www.semiconductorfabtech.com/industry.new/9907/20.07.shtml, no page numbers.

Oct. 15, 2001. Search Report prepared by the Austrian Patent Office for Singapore Patent Application No. 200004286-1.

NovaScan 2020. Feb. 2002. "Superior Integrated Process Control for Emerging CMP High-End Applications."

Johnson, Bob. Jun. 10, 2002. "Advanced Process Control Key to Moore's Law." Gartner, Inc.

Jul. 9, 2002. International Search Report prepared by the European Patent Office for PCT/US01/24910.

Jul. 29, 2002. International Search Report prepared by the European Patent Office for PCT/US01/27407.

Sonderman, Thomas. 2002. "APC as a Competitive Manufacturing Technology: *AMD's Vision for 300mm*." AEC/APC.

Boning, Duane et al. "Run by Run Control of Chemical-Mechanical Polishing." *IEEE Trans*. Oct. 1996. vol. 19, No. 4. pp. 307-314.

Moyne, James et al. "A Run-to-Run Control Framework for VLSI Manufacturing." *Microelectronic Processing '93 Conference Proceedings*. Sep. 1993, no page numbers.

Telfeyan, Roland et al. "Demonstration of a Process-Independent Run-to-Run Controller." *187th Meeting of the Electrochemical Society*. May 1995, no page numbers.

Moyne, James et al. "A Process-Independent Run-to-Run Controllers and Its Application to Chemical-Mechanical Planarization." *SEMI/IEEE Adv. Semiconductor Manufacturing Conference*. Aug. 15, 1995, no page numbers.

Moyne, James et al. "Adaptive Extensions to be a Multi-Branch Run-to-Run Controller for Plasma Etching." *Journal of Vacuum Science and Technology*. 1995, no page numbers.

Sachs, Emanuel et al. "Process Control System for VLSI Fabrication.", no page numbers.

Chaudhry, Nauman et al. "Active Controller: Utilizing Active Databases for Implementing Multi-Step Control of Semiconductor Manufacturing." *University of Michigan*. pp. 1-24, no date.

Chaudhry, Nauman et al. "Designing Databases with Fuzzy Data and Rules for Application to Discrete Control." *University of Michigan*. pp. 1-21, no date.

Chaudhry, Nauman A. et al. "A Design Methodology for Databases with Uncertain Data." *Univeristy of Michigan*. pp. 1-14, no date.

Khan, Kareemullah et al. "Run-to-Run Control of ITO Deposition Process." *Univeristy of Michigan*. pp. 1-6, no date.

Moyne, James et al. "Yield Improvement @ Contact Through Run-to-Run Control.", no date no page numbers.

Kim, Jiyoun et al. "Gradient and Radial Uniformity Control of a CMP Process Utilizing a Pre- and Post-Measurement Strategy." *Univeristy of Michigan*, no date no page numbers.

Jiyoun Kim, James Moyne, Chadi El Chemali, Rick Nadeau, Paul Smith, John Colt, Jonathan Chapple-Sokol, and Tarun Parikh. "Gradient and Radial Uniformity Control of a CMP Process Utilizing a Pre- and Post- Measurement Strategy.", no date or page numbers.

Shahid Rauf, and Mark J. Kushner. "Virtual Plasma Equipment Model: A Tool for Investigating Feedback Control in Plasma Processing Equipment." *IEEE*, pp. 486-494, no date.

Shahid Raul, and Mark J. Kushner. "Controller design issues in the feedback control of radio frequency plasma processing reactors." *American Vacuum Society*, pp. 704-712, no date.

Brett Cruden, Karen Gleason, and Herb Sawin. "Chemical Vapor Deposition (CVD) of Tefloon™-like Filsm for Use in Low-k Interlayer Dielectric Applications.", no date or page numbers.

Oct. 1, 2004. International Preliminary Examination Report for PCT Serial No. PCT/US03/23964.

Oct. 12, 2004. International Preliminary Examination Report for PCT Serial No. PCT/US02/19061.

Nov. 17, 2004. Written Opinion for PCT Serial No. PCT/US01/27407.

May 5, 2004. International Preliminary Examination Report for PCT/US01/27406.

Lantz, Mikkel. 1999. "Equipment and APC Integration at AMD with Workstream." *IEEE*, pp. 325-327.

Aug. 9, 2004. Written Opinion for PCT Serial No. PCT/US02/19063.

Aug. 18, 2004. International Preliminary Examination Report for PCT Serial No. PCT/US02/19116.

Sep. 9, 2004. Written Opinion for PCT Serial No. PCT/US02/21942.

Sep. 16, 2004. International Preliminary Examination Report for PCT Serial No. PCT/US02/24859.

US 6,150,664, 11/2000, Su (withdrawn)

\* cited by examiner

METHOD OF FEEDBACK CONTROL OF SUB-ATMOSPHERIC CHEMICAL VAPOR DEPOSITION PROCESSES

RELATED APPLICATIONS

This application claims priority under 35 U.S.C. § 119(e) from provisional application ser. No. 60/298,878 filed Jun. 19, 2001, which is incorporated by reference.

This application claims priority under 35 U.S.C. § 119(e) from provisional application ser. No. 60/349,576 filed Oct. 29, 2001, which is incorporated by reference.

This application claims priority under 35 U.S.C. § 119(e) from provisional application ser. No. 60/366,698, filed Mar. 21, 2002, which is incorporated by reference.

This application is also related to co-pending application filed on even date herewith and entitled "Feedback Control of Plasma-Enhanced Chemical Vapor Deposition Process," which is incorporated by reference.

FIELD OF THE INVENTION

The present invention generally relates to the process control of thin film deposition using sub-atmospheric chemical vapor deposition (SACVD) and more particularly to a method, medium and apparatus for providing feedback control of the SACVD deposition process.

BACKGROUND OF THE INVENTION

Sub-atmospheric chemical vapor deposition is used in semiconductor manufacturing to deposit thin films on substrates, for example, to deposit a silicon dioxide film on a silicon wafer. One use of sub-atmospheric CVD is in the deposition of pre-metal dielectrics (PMD). Sub-atmospheric CVD has a longer processing time than other forms of chemical vapor deposition, however, it has a much greater capability to fill trenches that are etched into wafers with very small dimensions. In these and other processes, the deposited film properties, i.e., film thickness, chemical homogeneity, and optical and mechanical properties, are important to the final device performance.

In most applications, a layer is deposited over existing features on a device. The excess coating is removed, or the variation in the coating is reduced in a subsequent chemical-mechanical deposition (CMP) step. The deposited film may also have features that are created on the film using a lithography process, followed by an etch process. Thin film deposition is an inherently complex process, thereby making it hard to simultaneously control film characteristics, such as optical and electrical properties, stresses in the film, etc., while maintaining uniform film thickness. Thin film deposition processes typically "drift" over time, causing the deposited film to deviate significantly from target values. Specifically, sub-atmospheric chemical vapor deposition introduces both radial and azimuthal thickness non-uniformity, both within and among wafers. While film thickness non-uniformity can be addressed in subsequent processing steps, the greater the deposition-induced non-uniformity, the more difficult it is to achieve within-wafer thickness uniformity in subsequent steps.

As microelectronics device feature sizes continue to shrink, it is necessary to have tighter controls in fabrication to maintain high yields. The semiconductor industry has developed run-to-run control of the various processing steps in a semiconductor fabrication process in order to reduce over process output variation from target. In run-to-run control, a product recipe with respect to a particular process is modified between machine runs so as to minimize process drift, shift, and variability. Post-process measurements are made periodically and are used along with empirical process models and drift compensation techniques to suggest new equipment settings for the next run. The development of feedback control has been largely empirical, based upon experimentally observed correlations between input and output measurements.

There has been some investigation into feedback control of plasma etch and deposition processes, both experimental and theoretical. Implementation of process control in these operations has been limited due to unavailability of suitable integrated metrology tools, limited process understanding and non-automated operational practices. Improvements in advanced process control and reduction of run-to-run variability in a sub-atmospheric chemical vapor deposition process are thus desired.

SUMMARY OF THE INVENTION

The present invention relates to a method, apparatus and medium for process control of sub-atmospheric chemical vapor deposition of a film onto a surface of a substrate, for example, a semiconductor wafer, in order to provide predetermined desirable film properties and improve wafer-to-wafer and within-wafer uniformity of film properties. The present invention uses a model (which can be implemented as a single model or multiple models) of the film deposition process to predict film deposition rate, film thickness uniformity and/or other film properties across the wafer surface. Deviations from the predicted outcome are used to update the model and set new deposition recipe parameters, which feed back into the process to enhance process results.

The use of multiple wafer regions in the deposition model that defines the deposited film (as contemplated by one or more embodiments of the present invention) provides greater control over the cross-film thickness. Furthermore, the methods, apparatus and mediums of the present invention (in one or more embodiments thereof) provide a model that distinguishes between depositions in different deposition chambers of the tool and between deposition parameters that are independently or commonly controlled for each chamber, thereby providing a better approximation of the tool behavior of each chamber. The methods, apparatus and mediums of the present invention (in one or more embodiments thereof) also provide a model that defines the relationship between the deposition model variables and film properties other than film thickness, allowing control of the chemical, optical and/or material properties of the thin film. In addition, the methods, apparatus and mediums of the present invention (in one or more embodiments thereof) provide models that better approximate tool behavior by accounting for effects such as tool idle time, the effect of earlier-processed wafers on the current wafer, or the reliability of a value for a measured film quality. These and other aspects of the present invention allow for better estimation of tool behavior and the prediction of optimal deposition recipes for achieving a target output, thus overcoming deficiencies of the conventional technology.

In one aspect of the present invention, a method of film deposition in a sub-atmospheric chemical vapor deposition (CVD) process includes:

a) providing a model for sub-atmospheric CVD deposition of a film that identifies one or more film properties of the film and at least one deposition model variable that correlates with the one or more film properties;

b) depositing a film onto a wafer using a first deposition recipe comprising at least one deposition recipe parameter that corresponds to the at least one deposition variable;

c) measuring a film property of at least one of said one or more film properties for the deposited film of step (b);

d) calculating an updated deposition model based upon the measured film property of step (c) and the model of step (a); and e) calculating an updated deposition recipe based upon the updated model of step (d) to maintain a target film property.

By "deposition recipe" it is meant a set of process characteristics or parameters used to deposit a film in a deposition process. One or more of the recipe parameters are used or varied to control or influence the outcome of the deposition process. A recipe parameter corresponds or maps to a deposition model variable when it is a value selected for the deposition variable.

In one or more embodiments of the present invention, the step of providing a model includes:

(f) depositing a film in a sub-atmospheric CVD process on at least one wafer in a deposition step using a deposition recipe comprising at least one deposition recipe parameter that corresponds to a deposition model variable;

(g) measuring a film property for each of the at least one wafers after the deposition of step (f);

(h) recording the deposition parameter and measured film property for each of the at least one wafers on a recordable medium; and (i) fitting the data to a linear or non-linear curve that establishes a relationship between the film property of a region of the film and the deposition model variable.

In another aspect of the invention, a sub-atmospheric chemical vapor deposition tool for deposition of a film includes a sub-atmospheric chemical vapor deposition apparatus comprising a pressure chamber, a vacuum system, means for heating a wafer and a gas delivery system; controlling means capable of controlling an operating (recipe) parameter of the deposition process; and a controller operatively coupled to the controlling means, the controller operating the controlling means to adjust the operating parameter of the deposition process as a function of a model for a film property. The model includes a deposition model for sub-atmospheric CVD deposition of a film that identifies one or more film properties of the film and at least one deposition model variable that correlates with the one or more film properties.

In another aspect of the invention, a computer readable medium including instructions being executed by a computer, the instructions including a computer-implemented software application for a sub-atmospheric chemical vapor deposition process is provided. The instructions for implementing the process include a) receiving data from a sub-atmospheric chemical vapor deposition tool relating to the film property of at least one wafer processed in the sub-atmospheric chemical vapor deposition process; and b) calculating, from the data of step (a), an updated deposition model, wherein the updated deposition model is calculated by determining the difference between an output of a film deposition model and the data of step (a).

In still another aspect of the invention, a sub-atmospheric chemical deposition tool includes:

a) modeling means for identifying one or more film properties of a film and at least one deposition model variable that correlates with the one or more film properties in a sub-atmospheric CVD deposition process;

b) means for depositing a film onto a wafer using a first deposition recipe comprising at least one deposition recipe parameter that corresponds to the at least one deposition variable;

c) means for measuring a film property of at least one of said one or more film properties for the deposited film of step (b);

d) means for calculating an updated deposition model based upon the measured film property of step (c) and the model of step (a); and e) means for calculating an updated deposition recipe based upon the updated model of step (d) to maintain a target film property.

BRIEF DESCRIPTION OF THE DRAWINGS

Various objects, features, and advantages of the present invention can be more fully appreciated with reference to the following detailed description of the invention when considered in connection with the following figures, in which like reference numerals identify like elements. The following drawings are for the purpose of illustration only and are not intended to be limiting of the invention, the scope of which is set forth in the claims that follow.

DETAILED DESCRIPTION OF THE INVENTION

Figure 1A:
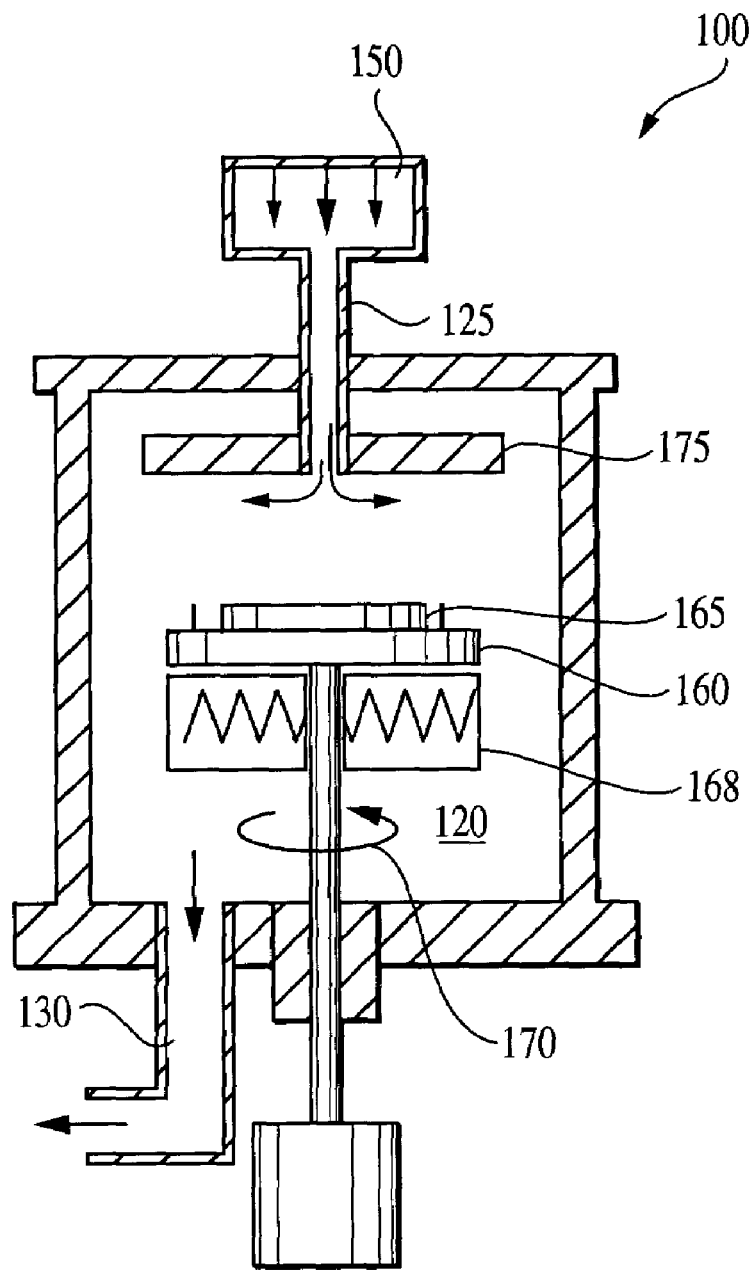
FIG. 1A is a schematic view of a sub-atmospheric chemical vapor deposition apparatus.

Sub-atmospheric chemical vapor deposition (SACVD) has been widely used in microelectronics fabrication to deposit films, such as a $SiO_2$, at low temperatures. In the SACVD process, reactive gases are introduced into the reaction chamber at sub-atmospheric pressures. The reactive gases flow over a heated wafer (e.g., 300–700° C.) where the desired chemical reactions occur and the product is deposited. FIG. 1A is a schematic illustration of an exemplary SACVD system 100. The system 100 includes a chamber 120, a vacuum system 130, a wafer holder 160 for supporting wafer 165, a gas or fluid delivery system 150 for introduction of reactive gases and a heater 168 for heating the wafer holder 160. Reactive gases are introduced into a reaction chamber 120 through inlet 125 of the gas delivery system 150. In order to promote a uniform distribution, the reactive gases typically are introduced into the chamber at a source positioned opposite or a distance from the wafer 165. The heated wafer holder 160 may be rotated for further uniformity of deposition, as indicated by arrow 170. The gas delivery system may include heating and cooling means (not shown) for maintaining a constant gas and chamber temperature. Wafers are transferred into and out of chamber 120 by a robot blade (not shown) through an insertion/removal opening (not shown) in the side of chamber 120. Two or more chambers may be connected. In at least some SACVD systems, the chambers share reactive gases, but have individual wafer temperature and showerhead controls.

Figure 1B:
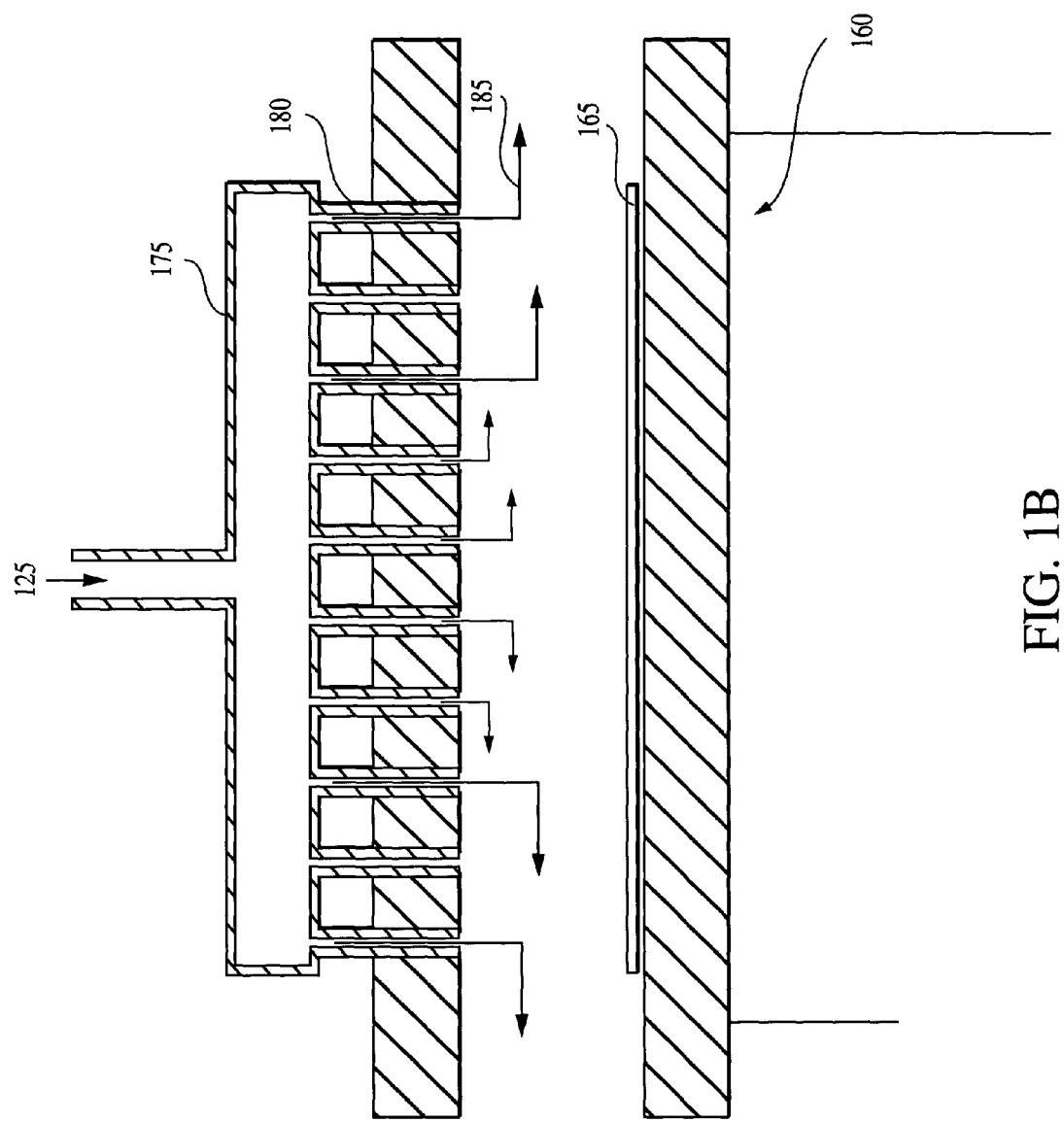
FIG. 1B is an enlarged view of the reaction chamber of the apparatus, for use in one or more embodiments of the present invention.

FIG. 1B is an enlarged view of the SACVD reaction chamber illustrating an exemplary delivery system for the reactive gases used in the SACVD process. The gases are introduced through inlet 125 into a heated gas distribution head (showerhead) 175, which has outlets 180 at spaced intervals. As shown by arrows 185 in FIG. 1B, the reactive gases then flow over the heated wafer, where they are deposited as a thin film. The elevated temperatures of the wafer promote reaction of the reactive gases and deposition of the product film.

The term "target output" represents the desired processing outcome of the sub-atmospheric chemical vapor deposition process. Some tolerance is built into the profile, so that the profile includes the target value and acceptable standard deviations therefrom. Film thicknesses or other measured film property falling within the standard deviation would not require updating of the deposition recipe. Thus, use of the term "target output" includes the target value and the standard deviation therefrom.

The term "wafer" is used in a general sense to include any substantially planar object onto which a film is deposited. Wafers include monolith structures or structures having one or more layers, thin films or other features already deposited thereon. "Thin film" and "film" may be used interchangeably, unless otherwise indicated.

An exemplary SACVD deposition system includes two or more chambers in which deposition of material occurs. The chambers can carry out the same process or different processes; some CVD systems are based on a series of operations, while some use parallel processing schemes. The SACVD chambers may thus process wafers in parallel, that is, each deposition chamber deposits a film on a wafer at the same time. The deposition recipe for each chamber may be the same or different. In one or more embodiments of the present invention, the chambers share some processing parameters while others are independently controlled. For example, gas flow of reactant gases is common to both (or all), but substrate temperature and showerhead spacing are independently controlled in each chamber.

In one or more embodiments, the process uses an SACVD system having twin chambers, which share the same gas distribution and thus have the same gas flow rates but which can have different heater temperatures and spacings (distance between the shower head and the substrate). In one or more embodiments, the SACVD chamber has three sets of twin chambers for a total of six chambers, such as the Producer™ available from Applied Materials in Santa Clara, Calif. The present invention is described with reference to SACVD, however is it readily apparent that other low pressure CVD processes are also contemplated. The present invention also is applicable to CVD systems using either a batch process or inline process. An inline process refers to a process in which all wafers going through a system go through a sequence of steps and those steps may be carried out in different chambers, whereas a batch process refers to a process in which a wafer goes to any one of the chambers in the system, where the entire deposition is then carried out.

The SACVD processes described above may be modeled to provide a format for improving the deposition process. The process model should accurately predict the thin film characteristics (output) for a given set of input conditions. The run-to-run film characteristics are improved or maintained by adjusting the deposition model during sub-atmospheric chemical vapor deposition to correct for unmodeled effects or to correct for drift in the deposition process conditions. Run-to-run control can be defined as wafer-to-wafer or lot-to-lot, depending upon the processes being controlled and the available methods for monitoring output.

Figure 2:
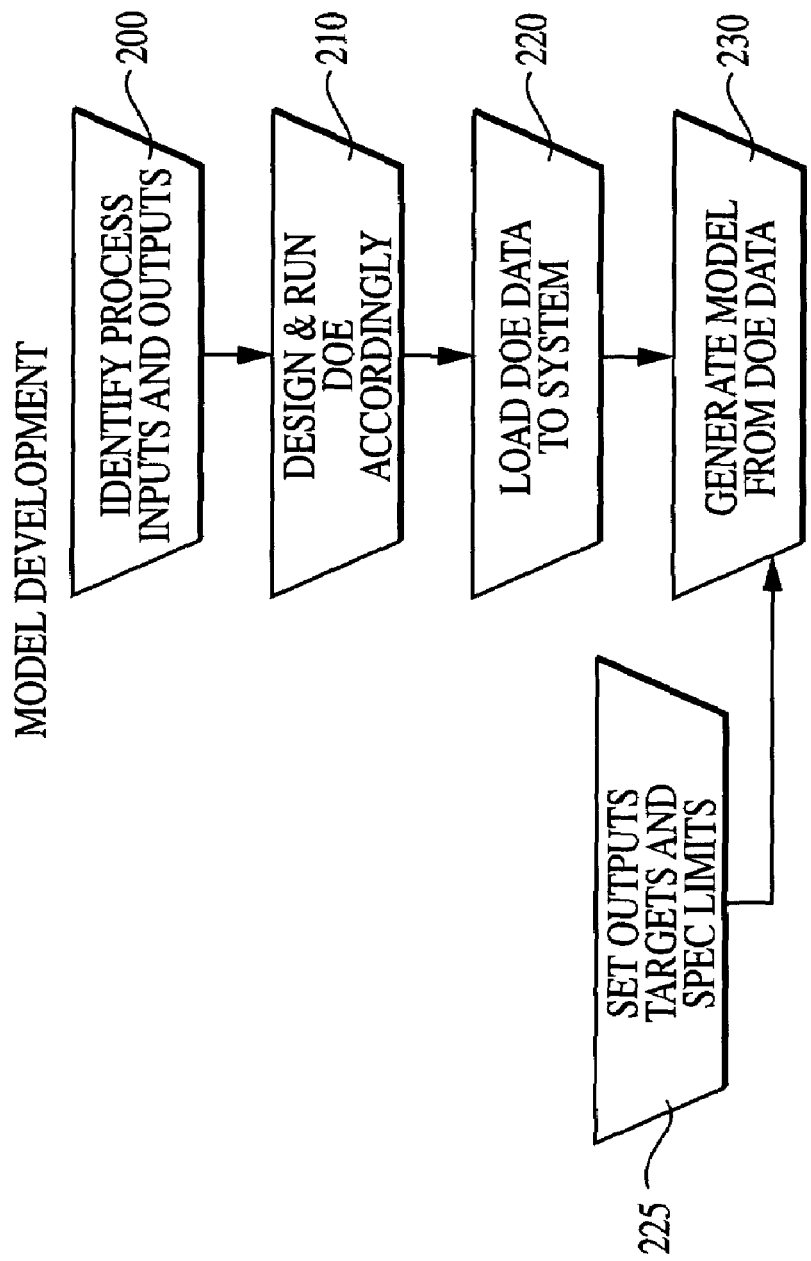
FIG. 2 is a flow diagram generally illustrating model development.

According to one or more embodiments of the present invention, an initial model is developed based upon knowledge of the film deposition process, as is shown in a flow diagram (FIG. 2). An initial understanding of the system is acquired in step 200, which is used to design and run a design of experiments (DOE) of step 210. The DOE desirably is designed to establish the relationship between or among variables that have a strong and predictable impact on the processing output one wishes to control, e.g., film thickness or some other film property. The DOE provides data relating to process parameters and process outcome, which is then loaded to the advanced process control system in step 220. The advanced process control system may be a controller or computer that uses the data to create and update the model. The model can be represented as raw data that reflects the system, or it can be represented by equations, for example multiple input-multiple output linear, quadratic and general non-linear equations, which describe the relationship among the variables of the system. Process requirements such as output targets and process specification are determined by the user in step 225, which are combined with the DOE data to generate a working model in step 230.

Figure 3:
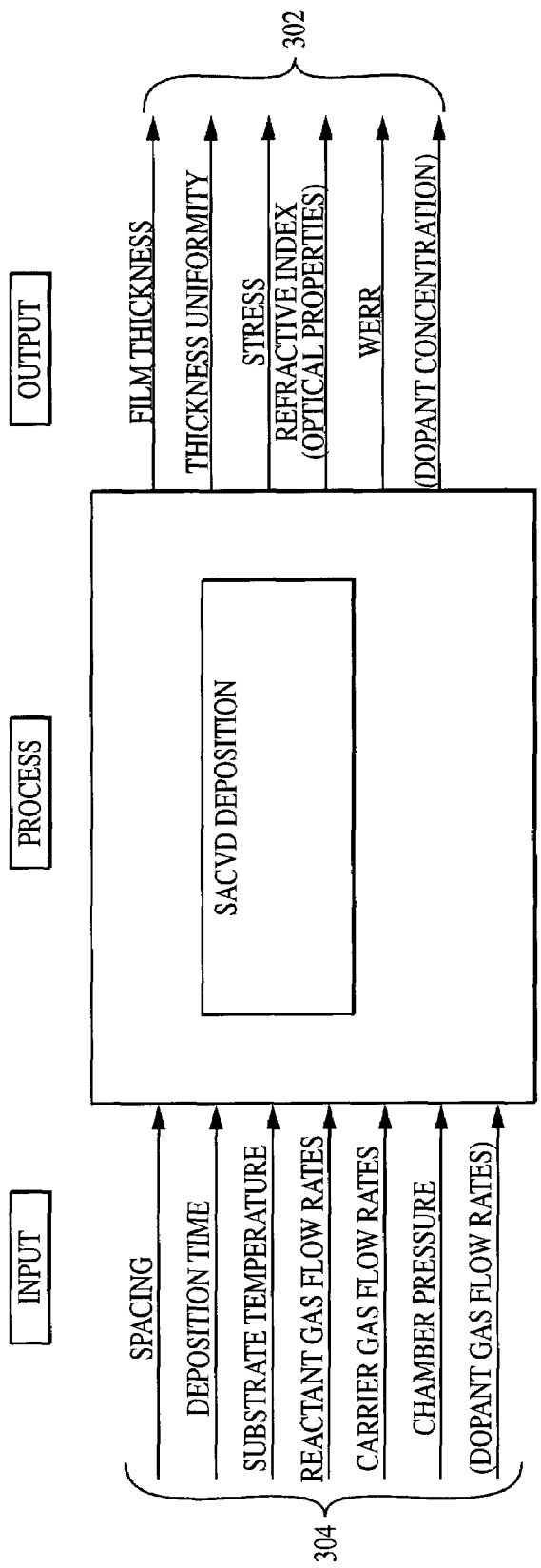
FIG. 3 is a schematic illustration showing the relationship between input and output variables in one or more embodiments of the present invention.

In developing the model, film properties of interest 302 are identified and outcome determinative processing model variables 304 are selected for the model, as illustrated schematically in FIG. 3. The specific film properties of interest may vary depending upon the type of film deposited, and thus the film properties of interest 302 and processing model variables 304 of FIG. 3 are shown by way of example.

Regardless of the type of film substance for which a model is created, to obtain DOE data, an experiment is run which perturbs or varies the values of the processing variables of interest about a center point (or median value). One or more processing variables can be varied. The film properties of interest in the resultant film are measured for each combination of inputs. Data can be acquired empirically, by carrying out a series of experiments over a range of values of the processing variables. The data is fit to the appropriate curve (linear or non-linear) to define the model.

Undoped silica glass (USG) is commonly deposited by SACVD and a model development is discussed below with specific reference to USG, although it is readily apparent that the methodology can be used to develop models for any other SACVD film deposition process. In particular, SACVD is well suited for the deposition of doped silica glass, such as boron- and phosphorous-doped silica.

In one or more embodiments of the present invention, the film properties of interest for USG film include one or more of film thickness, film thickness uniformity, stress, wet-etch rate ratio (WERR), and refractive index (RI). In one or more embodiments of the present invention, the model is developed for two or more film properties, for example, the model describes the effect of process variables on film thickness (deposition rate) and film stress, or on film thickness and refractive index. Process variables for deposition of the USG film include one or more of ozone flow rate, reactive gas flow rate, carrier gas flow rate, chamber pressure, wafer temperature, and showerhead spacing (distance) from the substrate, as well as total deposition time. Deposition time is controlled by the time of reactive gas flow. For the deposition of USG films, reactive gases typically include ozone ($O_3$), oxygen ($O_2$), and tetraethylorthosilicate (TEOS) or, alternatively, silane ($SiH_4$).

Models for other film deposition systems can be similarly developed using the processing variables and film properties specific to those films. For example, when doped silica films are modeled and controlled in a manner similar to that described for USG films, dopant concentration is included in the model.

In one or more embodiments of the present invention, a sub-atmospheric CVD process for deposition of boron-phosphosilicate glass is modeled. The level of dopant concentration is controlled by adjusting the flow rates of triethylborate (TEB) for boron and triethylphosphate (TEPO) for phosphorus. Gas flow rates for these dopant gases control the dopant level of boron and phosphorus incorporated into the final film. Processing variables include total deposition time, wafer temperature, ozone flow rate, TEOS, TEB, and TEPO gas flow rates, oxygen flow rate, nitrogen flow rate, chamber pressure and spacing. Process outputs (film properties) include film thickness and thickness uniformity, WERR, refractive index, stress, weight percent boron and weight percent phosphorus. An additional feature of the deposition of doped silica glass is that a change in spacing distance in order to individually control film thickness in the individual chambers also induces a change in the dopant concentration of the deposited film, i.e., the factors are coupled. Thus, if one determines that the two chambers do not produce matched film thicknesses, merely changing the spacings may result in films for which dopant specifications are not met unless TEB and TEPO flow rates are also adjusted. The model accounts for the relatedness between spacing and dopant concentration. The resultant interactions between the inputs and outputs requires the solution of an optimization problem for both input variables to determine the recipe which provides output predictions (targeted output) which best match the desired values of all film characteristics. Optimization is discussed in greater detail below.

On the Producer™ system from Applied Materials, gas distribution (e.g., gas composition and flow rate) is common to both twin chambers of the SACVD system. Deposition time can be controlled individually for each chamber by controlling the wafer temperature. In one or more embodiments of the present invention, the model can distinguish between the two types of processing variables (individual and common) and account for them accordingly. As discussed herein below, the model permits simultaneous optimization of more than one variable.

Figure 4:
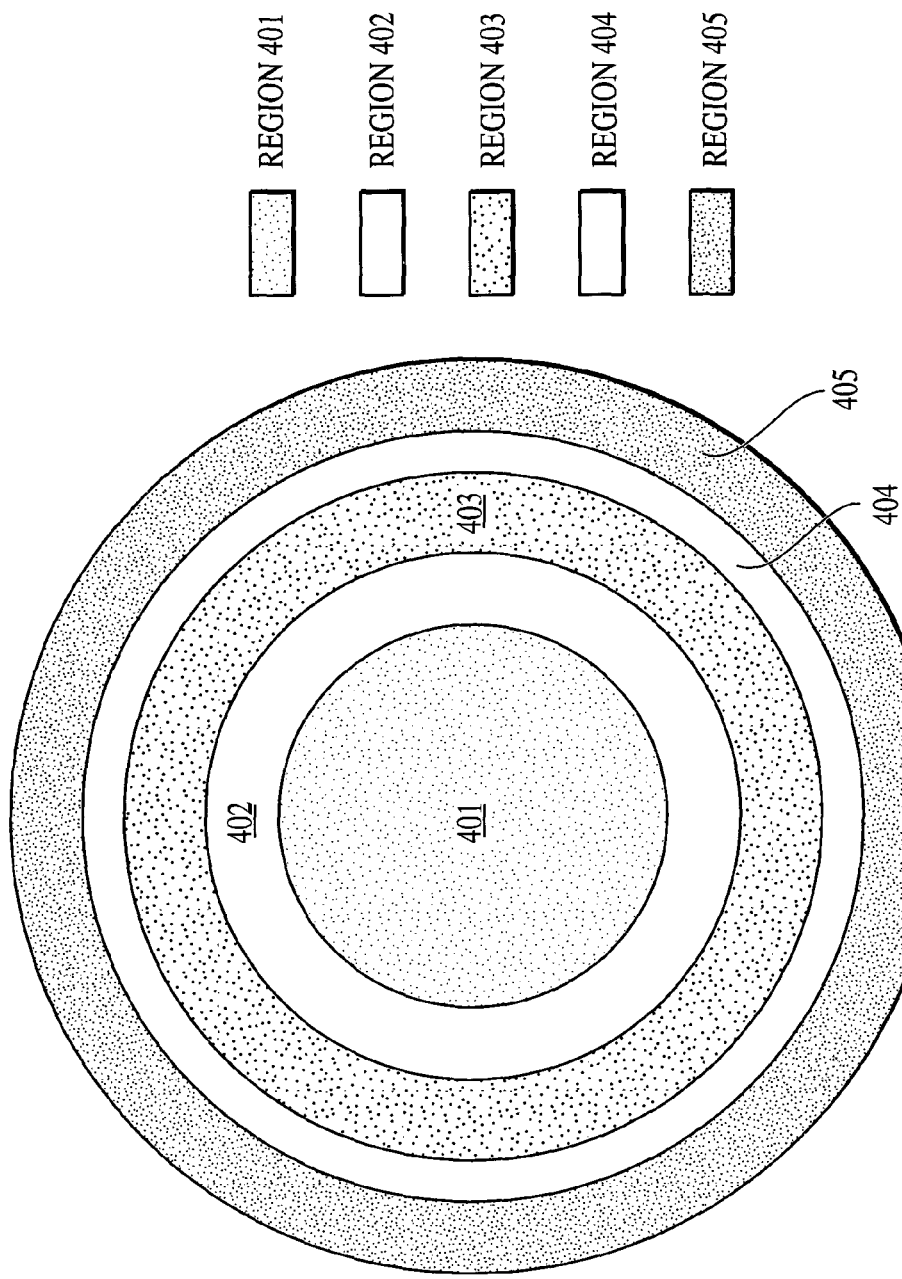
FIG. 4 schematic illustration of a wafer showing regions defined for thickness profile model.

In one or more embodiments of the present invention, the model defines two or more different film property, e.g., film thickness, regions of the wafer. As is shown in FIG. 4, a wafer is divided into annular regions 401 through 405 of varying width and area. The number, size and location of the regions also can vary and may be selected based upon any number of factors, including the variability or uniformity of the film property in a given region of the wafer. In one or more embodiments of the present invention, it is desirable that the film property in any given region be substantially uniform, particularly in those cases where, for example, a number of wafer thickness measurements within a region are averaged to define the region-averaged thickness profile. Thus, at the edges of the wafer where edge effects can be dramatic, narrow regions encompassing only the outer portions of the wafer may be selected. Near the center of the wafer where deposition effects may be subtler, a larger region may be defined. In one or more embodiments of the present invention, the regions are defined such that all azimuthal variation is averaged out. In one or more embodiments of the present invention, the use of an input value is contemplated to correct and account for azimuthal variation. Film property measurements taken within a region of the wafer are averaged to give the average film property value for that region.

By way of example (with reference to film thickness), the five wafer regions of FIG. 4 can be defined as shown in Table 1 for a wafer that is 95 mm in diameter.

TABLE 1

| Region | 401 | 402 | 403 | 404 | 405 |
|---|---|---|---|---|---|
| Radius, mm | 5–40 | 40–60 | 60–80 | 80–92 | 92–95 |

With the regions defined as in Table 1, all thin film thickness measurement points with a radial distance from the wafer center greater than 5 mm, but less than 40 mm, are averaged together to give the thickness of region 401. The thicknesses for all other regions are similarly calculated, but region 405 includes all points greater than 92 mm and up to and including 95 mm. Thus, a film is deposited by sub-atmospheric CVD and, based upon post-deposition thickness measurements and deposition time and/or other processing variables, a film thickness and deposition rate can be determined for each region.

In one or more embodiments of the present invention, a film property of interest is film thickness and one of the processing variables is deposition time. If the deposition time is manipulated through the time of reactive gas flow, and the gas flow is common to two chambers, then another variable can be used to account for differences in deposition rate among the chambers. Since there are separate heating sources for each chamber in the SACVD system, the substrate heating temperature and heating time in each chamber can be varied as a means for controlling final film thickness and as a means for adjusting differences in film thickness between deposition chambers. This provides the ability to control thin film final thickness even in the presence of differences in the chamber performances. Varying the spacing between the showerhead and the wafer also can control the film thickness, in this case, independently for each chamber. While film thickness is the measured output, it is appreciated that the information can be represented as a film deposition rate (film thickness per unit time) or as a film thickness profile (film thickness per unit area).

While film thickness and thickness uniformity are typically the tool behaviors being modeled, models for other film properties, such as stress, WERR (a measurement of film density) and RI, can be developed by manipulating deposition time, spacing and/or other processing variables. Multiple models for different film properties can be developed and used to describe the deposition process.

Once data from DOE runs are obtained, regression methods (or any suitable method) may be used to determine a model that obeys the behavior of the process within the range of inputs that were used in the experiments. In one or more embodiments of the present invention, the model for an i-chamber system is defined as shown in eq. (1), $$\text{Film\_thickness}_{ij} = DR_{ij} \cdot \text{time} \quad (1)$$

where i is the ith chamber of CVD tool, time is the deposition time, $\text{Film\_thickness}_{ij}$ is the film thickness in region j of the wafer in chamber i, and $DR_{ij}$ is the deposition rate for annular region j of chamber i, where no Einstein summation has been used for the indices. The model is determined for each region of the wafer and together the models define a film thickness profile across the wafer. Thus, the model can predict a film thickness profile by entering hypothetical parameters into the model equation. In use, a measured film thickness profile is used to further refine the model in order to obtain updated parameters and thus an updated process recipe.

The processing variable for a basic model is typically process time; however, additional deposition model variables can be included in the model. The relationship can be expressed generally as:

$$Q_{ij} = g(x_1, x_2 \ldots x_n) \quad (2a)$$

where Q is some film property in region j on a wafer in chamber i that is the result of a processing run; g( ) is some linear or nonlinear function of $x_1, x_2 \ldots x_n$ which are recipe parameters or tool state parameters that affect the resulting film property Q. If the film property of interest is thickness, the function g( ) represents the deposition rate as a function of recipe parameters or tool state parameters. The thickness for each region j of wafer in chamber i would then be derived by multiplying the deposition rate by the deposition time as shown below.

$$\text{Film\_thickness}_{ij} = g(x_1, x_2, \ldots, x_n)_{ij} \cdot \text{time} \quad (2b)$$

Models including additional processing parameters are shown in eqs. (2c)–(2e).

$$\text{Film\_thickness}_{ij} = (c_{1ij} \cdot \text{spacing}_i + c_{2ij} \cdot O_3\_\text{flow}_i + c_{3ij} \cdot TEOS\_\text{flow}_i + c_{4ij}) \cdot \text{time} \quad (2c)$$

$$\text{Stress}_i = (b_{1i} \cdot \text{spacing}_i + b_{2i} \cdot O_3\_\text{flow}_i + b_{3i} \cdot TEOS\_\text{flow} + b_{4i}) \quad (2d)$$

$$RI_i = (a_{1i} \cdot \text{spacing}_i + a_{2i} \cdot O_3\_\text{flow}_i + a_{3i} \cdot TEOS\_\text{flow} + a_{4i}) \quad (2e)$$

where $c_{1ij}$ through $c_{4ij}$ are the parameters which provide the contribution of the particular processing variable to the film thickness in region j for a wafer in the $i^{th}$ chamber; $b_{1i}$ through $b_{4i}$ are the parameters which provide the contribution of the particular processing variable to the film stress for the wafer in the $i^{th}$ chamber, and $a_{1i}$ through $a_{4i}$ are the parameters which provide the contribution of the particular processing variable to the refractive index of the film to the wafer in the $i^{th}$ chamber. In one or more embodiments of the present invention, the film property, e.g., film thickness, is modeled in defined annular regions on the wafer. In one or more embodiments of the present invention, film properties, e.g., stress and refractive index, are modeled for the entire film. The process variables of equations (2c)–(2e) are exemplary; other process variables can be used to define tool behavior with respect to the noted film properties.

The exemplary models provided above include common process variables that affect both chambers and independent process variables that affect each chamber individually. The models can describe tool behavior in one or more regions of the film corresponding to different annular regions of the wafer. This allows the controller to perform controls on multiple film regions simultaneously. This multiple region control provides control of within wafer uniformity. Thus, the model can account for an unlimited number of processing variables and permits their optimization while taking into consideration whether they affect all or only individual deposition chambers, or whether they affect different regions of the film differently.

In one or more embodiments of the present invention, the model may be further augmented to include the effect of the tool state. The tool state takes into consideration the effect of wear and use on the tool, here, a SACVD apparatus. This function is typically expressed as a scaling factor that takes the tool state into consideration. Factors that can affect tool state include idle time (time since last film deposition) and frequency of cleaning (or number of wafers deposited between cleaning or other shut down operation, such as preventative maintenance).

The first wafers coated after the tool has been idle typically have a different deposition rate than subsequently coated wafers, a situation known as the "first wafer effect". In one or more embodiments of the present invention, the model is further modified to account for the effect of tool idle time on film deposition rate. The model accounts for such variations on deposition rate by monitoring the idle time of the system and adjusting the deposition rate accordingly. Thus, a statement is placed within the model, which reflects the effect of idle time on processing, such as:

If (idle time)>5 min $$\text{Deposition time}=x; \quad (3)$$

Else

Deposition time=y.

This captures the idle time dependence within the model. In one or more embodiments of the present invention, the model has a more gradual change from one deposition rate to another and is given by the following equation:

$$DR_{idle} = DR_{no\_idle} \cdot (d_1 \cdot \tan^{-1}(d_2 \cdot \text{idle\_time} + d_3) + d_4) \quad (4)$$

where $DR_{idle}$ is the deposition rate with the effect of idle time, $DR_{no\_idle}$ is the deposition rate when there is no idle time, $d_1$ and $d_4$ determines the maximum change in deposition rate which is caused by idle time, $d_2$ determines the rate at which this change occurs, and $d_3$ determines at what idle time the change in deposition rate begins to be significant. In the general case, the effect of idle time on deposition rate can be given by the following equation:

$$DR_{idle} = f(DR_{no\_idle}, \text{idle\_time}, x_1, x_2, \ldots x_n) \quad (5)$$

where $f( )$ is some function which describes how the deposition rate is a function of the deposition rate when there is no idle time, the idle time, and other past or current process parameters related to the controller, tool state, or wafer state, here denoted by $x_1, x_2, \ldots, x_n$.

The "first wafer effect" is a member of a broader class of events, in which a single wafer measurement differs significantly from previous and subsequent measurements run on a specific tool or resource and, as such, does not represent an accurate representation of the process tool during normal operation. Accordingly, when these measurements are used in a feedback control system, this erroneous information may cause the system performance to deteriorate. These sudden changes can be the result of abrupt changes in the processing equipment, such as starting up the process after the system has been idle for a time, or it can be due to processing errors, such as an error in the metrology system. Since these sudden changes do not accurately reflect the subsequent behavior of the process tool, a methodology is used to evaluate the reliability of the measurement.

In one or more embodiments of the present invention, a methodology is provided within the model for assessing the reliability of the measurement. The methodology (i) estimates the intrinsic variation in the process, (ii) determines when a recent measurement is outside normal operating variation and, if so, marks the data as suspicious, and (iii) ignores the data until a trend is determined from subsequent data. This methodology allows the system to be sensitive to changes that occur over more than one wafer, but also provides the system with robustness over metrology failures or situations similar to the first wafer effect.

Once a process model is available, the model can be used to calculate an optimal set of recipe parameters in order to deposit a uniform film to a desired thickness. Conversely, using models such as those just described, a prediction for region-averaged film thickness can be calculated given the deposition time and any other variables that are measured or varied. By individually optimizing for the regions j of the wafer, greater control over the total surface is attainable. Thus, greater within wafer film uniformity is achieved.

An exemplary optimization method, which can be used in determining an updated model (based on the differences between measured and predicted values for a target output) for determining an updated deposition recipe, solves the equation:

$$\min_x f(y^{sp}, g(x)) \quad (6)$$

where x is a vector of recipe parameters and other processing parameters corresponding to the deposition recipe; g(x) is the model for the SACVD process which predicts the film properties based on a recipe and measurements related to tool state; $y^{sp}$ is a vector of the desired average region film thicknesses and/or other controlled film properties; and $f(y^{sp}, g(x))$ is some function which is meant to compensate for the deviation between the model predictions g(x) and the desired values $y^{sp}$. The updated model is then used to determine an updated deposition recipe.

Thus, the optimization method suggests that the model need not correct for 100% of the deviation from predicted values. A function may also be used, as contemplated by one or more embodiments of the present invention, to reflect uncertainty in the measured or calculated parameters, or to "damp" the effect of changing recipe parameters too quickly or to too great an extent. It is possible, for example, that without this "damping" effect the controller overcompensates for the measured deviations thereby necessitating another adjustment to react to the overcompensation. This leads to oscillations that may take several runs before the final, optimized conditions are realized.

Based upon this control method, the post-deposition film thickness is measured and the difference between the predicted thickness and the final (i.e., actual) thickness is determined. Other controlled film properties are measured, as needed by the model. In one or more embodiments of the present invention, the film property is measured on a lot-to-lot basis. For example, dopant concentration in doped silica glass can be measured on a lot-to lot basis since it is often difficult to determine dopant level in-line. In one or more embodiments of the present invention, the reliability of the data is assessed before the data is used in updating the model.

The error in prediction, also known as a bias, can then be linearly added into the model such that the actual final thickness more closely matches the predicted (and typically targeted) final thickness. This bias is added to each region j of wafer in chamber i, which is modeled as is shown in the following equation:

$$\text{Film\_thickness}_{ij} = g(x_1, x_2, \ldots x_n)_{ij} \cdot \text{time} + e_{ij} \quad (7)$$

where $e_{ij}$ is the bias term, which arises due to the difference between the predicted and actual amount deposited for region j of wafer in chamber i. The process of linearly updating a model with bias terms based upon the difference between a model prediction and an actual measurement is part of at least some feedback control in one or more embodiments of the present invention.

Instead of (and/or, in addition to) use of the aforementioned bias, one or more embodiments of the present invention contemplate that an updated recipe can be calculated to optimize the available recipe parameters and to drive the predictions to a target value. The recipe parameters are changed such that the film thickness is made constant even though the deposition rate may be varying. A methodology that automatically changes the recipe to achieve consistent film thickness not only improves the consistency of the resultant film thickness, but also improves the productivity of the tool, since the system is subject to less frequent down time for reconditioning. This consistent film thickness then improves the yield of the resultant product.

Process model development and optimization are carried out with reference to a specific deposition system. That is, conditions that effect the thin film characteristics are specific to the type of thin film being deposited and the tool used for deposition. It is recognized that many other films are and can be deposited using SACVD, and that models for their deposition can be similarly developed using the methodology and guidelines set forth herein. In one or more embodiments of the present invention, it is contemplated that a separate model (or at least a supplement to a composite model) is created for each thin film that is deposited. Alternatively, a model may be developed in reference to a previously developed model. This model may be product specific and take the original model and scale it based upon the differences between the products.

An example of the use of an initial model developed as described herein above to control the run-to-run average thickness and the thickness uniformity of the deposition process and to provide a feedback loop for updating the deposition recipe is shown schematically in FIG. 5. Briefly, one or more wafers is processed according to a first deposition recipe. The actual number of wafers depends on the complexity of the model and can be about 10, or as many as 20–30 or more. A thickness measurement is taken across the deposited film to obtain a film thickness profile, which is compared to the predicted film thickness profile calculated by the model. If the measured film thickness profile indicates deviation from the predicted results, those deviations are used to update the model to better reflect the behavior of the processing tool. The updated model is then used in a feedback loop to progressively match the behavior of the processing tool and to optimize the recipe so as to improve or maintain within wafer film thickness uniformity.

Figure 5:
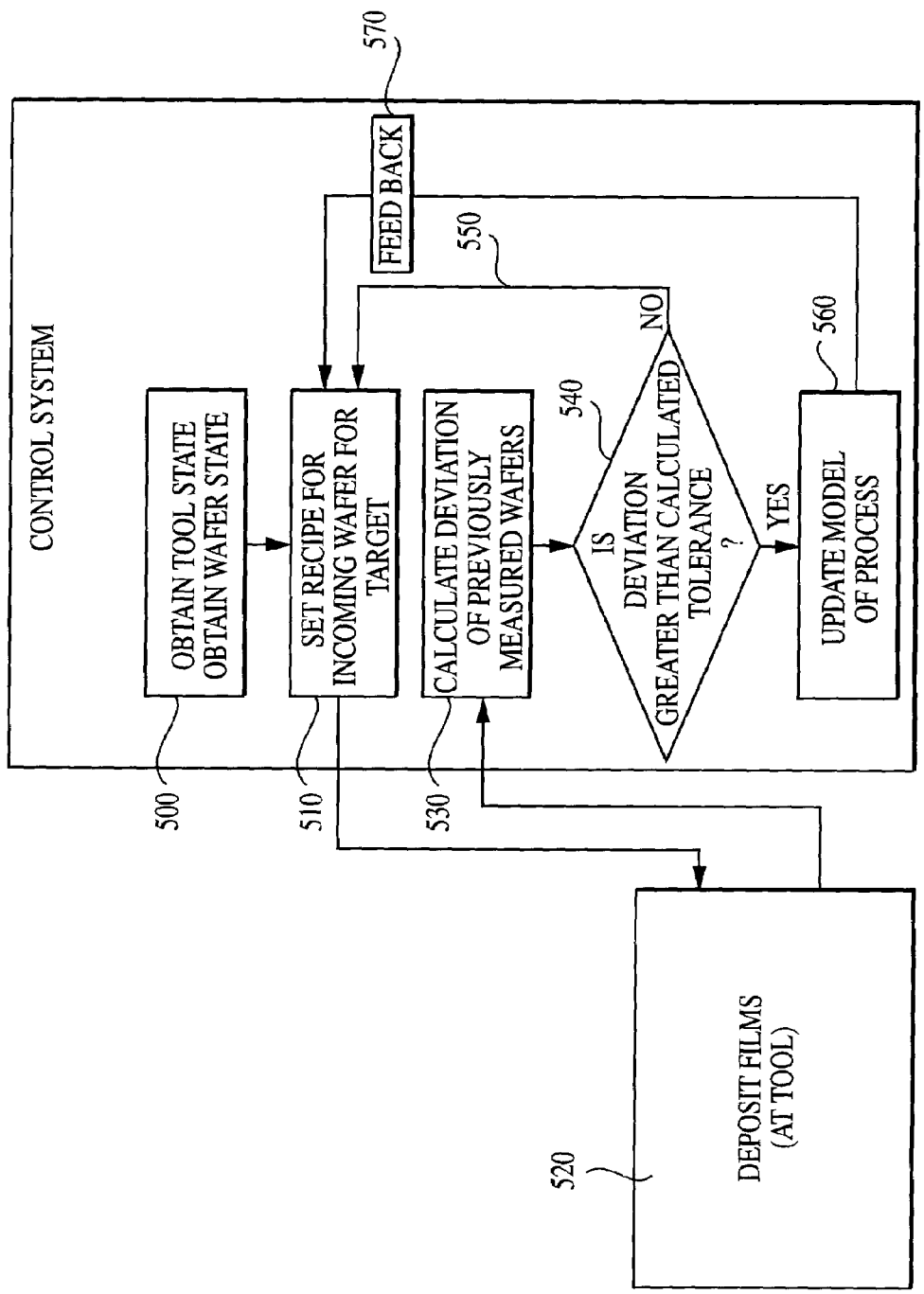
FIG. 5 is a flow diagram of the feedback loop used in a SACVD deposition operation, as contemplated by one or more embodiments of the present invention.

According to the processing flow diagram in FIG. 5, initial processing conditions (e.g., an initial tool state and initial wafer state) are identified that will provide a desired film deposition profile in step 500. The initial conditions may be determined empirically or by using the processing model of one or more embodiments of the present invention. If a processing model is used, a controller can use this model to calculate step times and processing parameters (i.e., to set the recipe for one or more incoming wafers) to deposit a film having a target (in some cases, a flat) profile on an incoming profile with a desired thickness as shown in step 510. Thin films are deposited according to the initial deposition recipe in the SACVD tool at step 520. The thickness of the deposited film is measured and deviation from the predicted thickness is determined in step 530. In step 540 it is determined whether the deviation between the predicted and observed behavior exceeds an established tolerance. If the deviation is within acceptable ranges, no changes are made to the model and the recipe is unchanged (step 550). If the deviation is outside acceptable limits, then this information is marked to trigger a change in the model as described in step 560 and this information is fed back to the model in step 570 and thus into the controller where the deposition recipe is optimized according to an updated model that takes the deviation from the predicted value into consideration. The deposition step can be repeated and further updates of the deposition recipe are possible.

As is the case in most feedback systems, the process variables that are measured on-line (in this case with an integrated metrology unit on the tool) are updated in the model based upon the error between the prediction and the actual measurement. In the case of SACVD-processed films, one or more embodiments of the present invention contemplate that both uniformity and thickness are measured on-line and are used for updating the process model. Other controlled film properties can be measured on-line or off-line. In some cases these measurements would be performed on a lot-to-lot basis. That is, upon completion of the lot (usually 25 wafers) the wafers are brought to an external metrology tool where several wafers of the lot are measured.

In one or more embodiments of the present invention, film properties, e.g., stress and refractive index, are not measured and are handled in much the same way output constraints are handled in model predictive control. The use of output constraints in mode predictive control can be seen in the following optimization relationship:

$$\min_x f(y^{sp}, g(x)) \quad (8)$$

$$s.t. h(x) \leq 0,$$

where h(x) is some constraint that is placed on the prediction of an unmeasured output. In one or more embodiments of the present invention, output constraints for the SACVD tool are applied to control the prediction of stress and refractive index. This optimization formulation constrains the prediction of the model to be within some limit, or set of limits, while still finding recipe parameters which yield the desired thickness and uniformity. Thus, as long as the recipe parameters are within stated maximum and minimum values, it is assumed that constrained output values are within allowable maximum and minimum values.

In one or more embodiments of the present invention, a feedback control methodology combines the chambers into a single model using the average of the tool states for each of the chambers. The single model would use the feedback approach described above to apportion the bias adjustment across the different chambers in some predetermined way.

When multiple process tools perform in series, also known as being run within a module, the performance of one tool can have a strong effect on the performance of subsequent tools. Accordingly, the performance of subsequent tools may be optimized by adjusting the performance of previous tools. For the specific case of ILD CVD, the standard way of performing the task is to deposit a film that has the most uniform film possible. Then, the ILD CMP is tasked with removing a certain amount of this film with as uniform a removal rate as possible. Unfortunately, the CMP removal profile is not as uniform as the deposition profile from the CVD tool. However, by manipulating the profile which results from the CVD tool, the shortcomings of the CMP tool can be addressed by providing an incoming profile which alleviates the resulting non-uniformities caused by the CMP tool.

Also, in one or more embodiments of the present invention, a feedback control scheme uses the final thickness measurements to distribute feedback individually to all of the chambers. Because each chamber can be can be treated individually, the tool state, i.e., cleaning frequency and idle time, can be included in the model and feedback can be specific to the chamber and deposition recipe. This feedback control scheme is particularly useful when different deposition recipes are being carried out in each chamber or when drift varies between chambers. The ability to separately model each chamber provides a greater of degree processing flexibility, since it allows one to change the processing recipe in one chamber (perhaps because film properties are drifting) while keeping the processing recipe at the remaining chamber unchanged (perhaps where film properties are within target ranges). When changes to the processing recipe are made to only one chamber, chamber-specific processing parameters are adjusted.

Feedback and feedforward control algorithms are constructed for use in the above control process based on the above models using various methods. The algorithms may be used to optimize parameters using various methods, such as recursive parameter estimation. Recursive parameter estimation is used in situations such as these, where it is desirable to update the model on line at the same time as the input-output data is received. Recursive parameter estimation is well suited for making decisions on line, such as adaptive control or adaptive predictions. For more details about the algorithms and theories of identification, see Ljung L., *System Identification—Theory for the User*, Prentice Hall, Upper Saddle River, N.J. 2nd edition, 1999.

In one or more embodiments of the present invention, the deposition recipe may be updated in discrete increments or steps defined in the algorithms of the model. Also, in one or more embodiments of the present invention, the updated recipes may be determined by interpolation to the appropriate parameters.

Additional apparatus utilized to implement the feedforward and feedback loop include tools for measuring a film property, e.g., a film thickness measurement (metrology) tool to provide thickness data needed to calculate film deposition rate. The tool may be positioned relative to the SACVD apparatus so as to provide in-line measurements, or it may be located remote from the apparatus. The tool may use optical, electrical, acoustic or mechanical measurement methods. A suitable thickness measurement device is available from Nanometrics (Milpitas, Calif.) or Nova Measuring Instruments (Phoenix, Ariz.). Other tools may be integrated into the system for the measurement of film properties such as trench depth, dopant concentration, refractive index, or any other measurable film property that is modeled and controlled. The measurement is made wafer-to-wafer or lot-to-lot and may be provide in-line or off-line measurements.

A computer may be utilized to calculate the optimal film deposition recipe based upon the measured film thickness and calculated deposition rate, employing the models and algorithms provided herein. A suitable integrated controller iAPC (integrated advanced process control) is available from Applied Materials (Santa Clara, Calif.).

Figure 6:
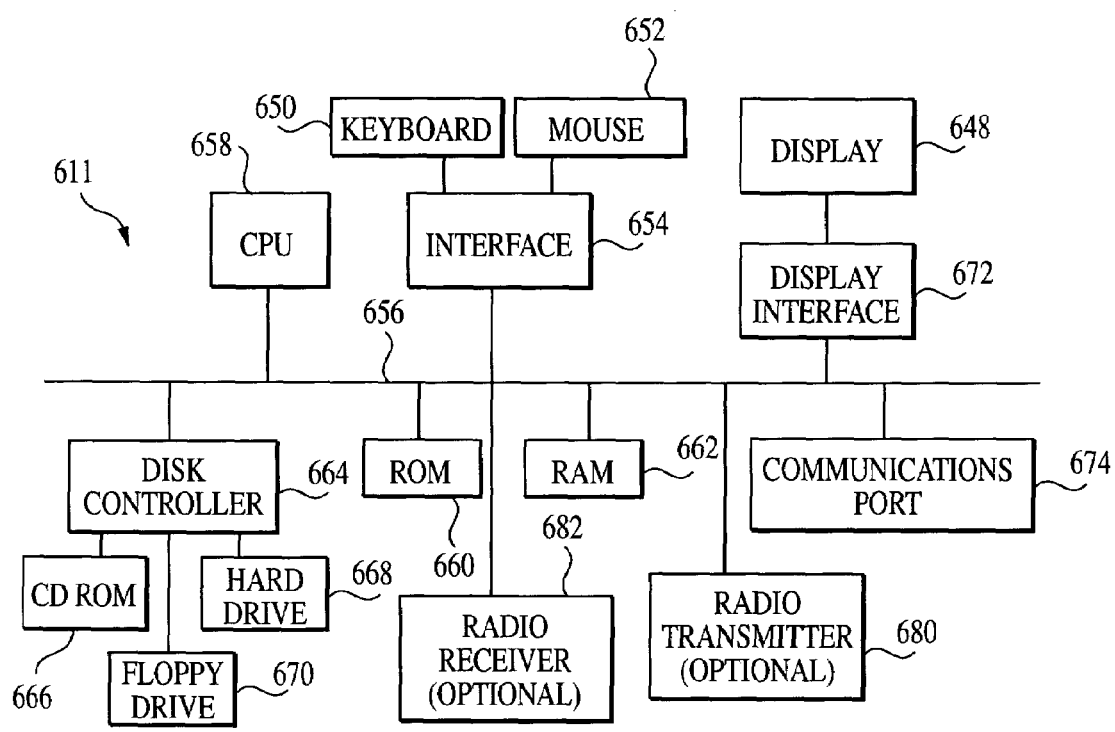
FIG. 6 is a block diagram of a computer system that includes tool representation and access control for use in one or more embodiments of the present invention.

Various aspects of the present invention that can be controlled by a computer can be (and/or be controlled by) any number of control/computer entities, including the one shown in FIG. 6. Referring to FIG. 6 a bus 656 serves as the main information highway interconnecting the other components of system 611. CPU 658 is the central processing unit of the system, performing calculations and logic operations required to execute the processes of embodiments of the present invention as well as other programs. Read only memory (ROM) 660 and random access memory (RAM) 662 constitute the main memory of the system. Disk controller 664 interfaces one or more disk drives to the system bus 656. These disk drives are, for example, floppy disk drives 670, or CD ROM or DVD (digital video disks) drives 666, or internal or external hard drives 668. These various disk drives and disk controllers are optional devices.

A display interface 672 interfaces display 648 and permits information from the bus 656 to be displayed on display 648. Display 648 can be used in displaying a graphical user interface. Communications with external devices such as the other components of the system described above can occur utilizing, for example, communication port 674. Optical fibers and/or electrical cables and/or conductors and/or optical communication (e.g., infrared, and the like) and/or wireless communication (e.g., radio frequency (RF), and the like) can be used as the transport medium between the external devices and communication port 674. Peripheral interface 654 interfaces the keyboard 650 and mouse 652, permitting input data to be transmitted to bus 656. In addition to these components, system 611 also optionally includes an infrared transmitter and/or infrared receiver. Infrared transmitters are optionally utilized when the computer system is used in conjunction with one or more of the processing components/stations that transmits/receives data via infrared signal transmission. Instead of utilizing an infrared transmitter or infrared receiver, the computer system may also optionally use a low power radio transmitter 680 and/or a low power radio receiver 682. The low power radio transmitter transmits the signal for reception by components of the production process, and receives signals from the components via the low power radio receiver. The low power radio transmitter and/or receiver are standard devices in industry.

Although system 611 in FIG. 6 is illustrated having a single processor, a single hard disk drive and a single local memory, system 611 is optionally suitably equipped with any multitude or combination of processors or storage devices. For example, system 611 may be replaced by, or combined with, any suitable processing system operative in accordance with the principles of embodiments of the present invention, including sophisticated calculators, and hand-held, laptop/notebook, mini, mainframe and super computers, as well as processing system network combinations of the same.

Figure 7:
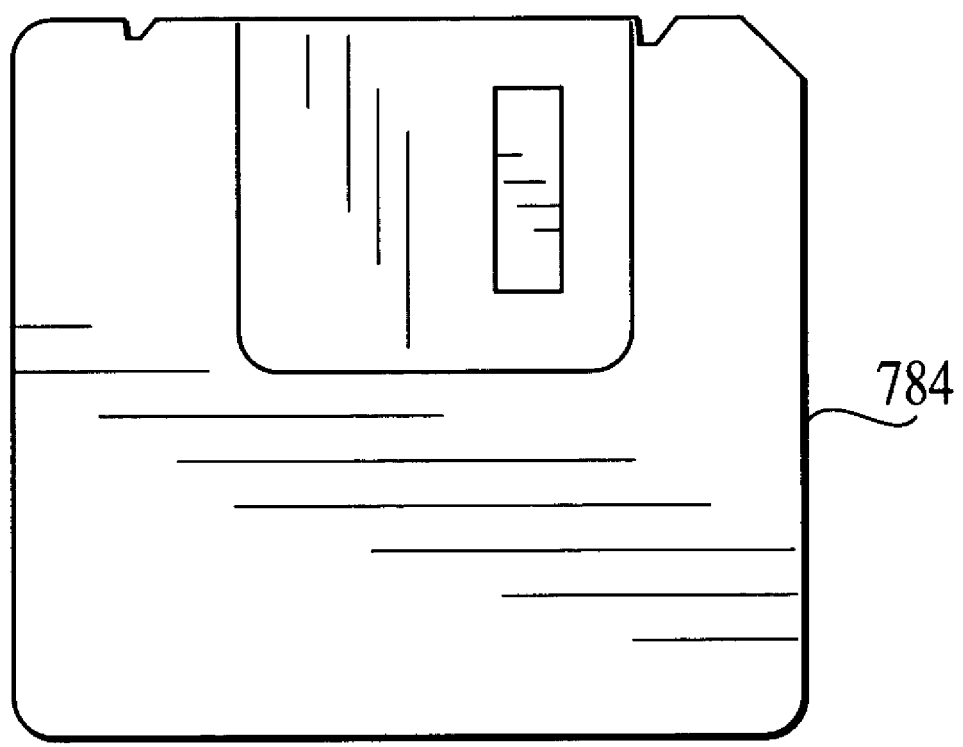
FIG. 7 is an illustration of a floppy disk that may store various portions of the software according to one or more embodiments of the present invention.

FIG. 7 is an illustration of an exemplary computer readable memory medium 784 utilizable for storing computer readable code or instructions. As one example, medium 784 may be used with disk drives illustrated in FIG. 6. Typically, memory media such as floppy disks, or a CD ROM, or a digital videodisk will contain, for example, a multi-byte locale for a single byte language and the program information for controlling the above system to enable the computer to perform the functions described herein. Alternatively, ROM 660 and/or RAM 662 illustrated in FIG. 6 can also be used to store the program information that is used to instruct the central processing unit 658 to perform the operations associated with the instant processes. Other examples of suitable computer readable media for storing information include magnetic, electronic, or optical (including holographic) storage, some combination thereof, etc. In addition, at least some embodiments of the present invention contemplate that the medium can be in the form of a transmission (e.g., digital or propagated signals).

In general, it should be emphasized that various components of embodiments of the present invention can be implemented in hardware, software or a combination thereof. In such embodiments, the various components and steps are implemented in hardware and/or software to perform the functions of the present invention. Any presently available or future developed computer software language and/or hardware components can be employed in such embodiments of the present invention. For example, at least some of the functionality mentioned above could be implemented using the C, C++, or any assembly language appropriate in view of the processor(s) being used. It could also be written in an interpretive environment such as Java and transported to multiple destinations to various users.

Although various embodiments that incorporate the teachings of the present invention have been shown and described in detail herein, those skilled in the art can readily devise many other varied embodiments that incorporate these teachings. All references mentioned herein are incorporated by reference.

What is claimed is:

1. A method of film deposition in a run-to-run chemical vapor deposition (CVD) process, comprising:
    a) providing a model for CVD deposition of a film, wherein the model is responsive to a tool state of the CVD process and identifies one or more film properties of the film and at least one deposition model variable that correlates with the one or more film properties;
    b) depositing a film onto a first substrate using a first deposition recipe comprising at least one deposition recipe parameter that corresponds to the at least one deposition variable;
    c) measuring a film property of at least one of said one or more film properties for the deposited film of step (b);
    d) calculating an updated deposition model based upon the measured film property of step (c) and the model of step (a),
        wherein said updated model is calculated after each run of the run-to-run process; and
    e) calculating an updated deposition recipe for use in a film deposition onto a second substrate based upon the updated model of step (d) to maintain a target film property.

2. The method of claim 1, wherein the model of step (a) defines a plurality of models for a plurality of regions on a wafer and identifies a film property for two or more of said plurality of regions of the wafer and at least one deposition model variable that correlates with the film property.

3. The method of claim 2, wherein the film property comprises film thickness and the step of measuring the film property further comprises determining a film thickness profile.

4. The method of claim 2, wherein calculating an updated model in step (d) comprises updating the models for one or more of the plurality of regions of the wafer.

5. The method of claim 4, wherein calculating an updated recipe in step (e) comprises updating the recipe for one or more of the plurality of regions of the wafer.

6. The method of claim 2, wherein the plurality of regions in the model of step (a) comprises annular regions extending outward from a center point on the wafer.

7. The method of claim 1, wherein the first deposition recipe is based on the model of step (a).

8. The method of claim 1, wherein the first deposition recipe is determined empirically.

9. The method of claim 1, wherein the film property of step (c) is an average film property.

10. The method of claim 1, wherein the model defines deposition of a plurality of films onto a plurality of wafers in a plurality of deposition chambers.

11. The method of claim 10, wherein the model provides for independent control of at least one deposition parameter for at least two of said plurality of deposition chambers.

12. The method of claim 11, wherein the independent deposition parameter is selected from the group consisting of showerhead spacing and wafer temperature.

13. The method of claim 10, wherein the model provides for common control of at least one deposition parameter for at least two of said plurality of deposition chambers.

14. The method of claim 13, wherein the common deposition parameter is selected from the group consisting of chamber pressure, reactive gas flow rate, carrier gas flow rate, dopant gas flow rate, and deposition time.

15. The method of claim 10, wherein the deposition recipe of step (b) in each chamber is the same.

16. The method of claim 10, wherein the deposition recipe of step (b) in each chamber is different.

17. The method of claim 10, wherein the calculating step of step (e) comprises calculating updated deposition recipes for at least two of said plurality of deposition chambers.

18. The method of claim 1, wherein the model provides for the effect of tool idle time of the CVD deposition process.

19. The method of claim 18, wherein the model defines a first deposition time when the idle time is more than a predetermined period and a second deposition time when the idle time is less than the predetermined period.

20. The method of claim 1, wherein the step of providing a model comprises:
(f) depositing a film on at least one wafer in a deposition step using a deposition recipe comprising at least one deposition recipe parameter and at least one tool state parameter that corresponds to a deposition model variable;
(g) measuring a film property for each of the at least one wafers after the deposition of step (f);
(h) recording the deposition parameter and measured film property for each of the at least one wafers on a recordable medium; and
(i) fitting the data to a linear or non-linear curve that establishes a relationship between the film property of a region of the film and the deposition model variable.

21. The method of claim 20, wherein the model constrains the deposition parameter to within predetermined maximum and minimum values.

22. The method of claim 1 or 20, wherein the at least one deposition parameters includes one or more of the parameters selected from the group consisting of deposition time, substrate temperature, ozone flow rate, reactive gas flow rate, carrier gas flow rate, dopant gas flow rate, chamber pressure and shower head spacing from the wafer.

23. The method of claim 22, wherein the at least one deposition parameter comprises deposition time.

24. The method of claim 1 or 20, wherein the one or more film properties includes one or more film properties selected from the group consisting of film thickness, film thickness uniformity, stress, wet-etch rate ratio (WERR), dopant concentration, and extinction coefficient, and refractive index (RI).

25. The method of claim 24, wherein the one or more film properties comprises film thickness.

26. The method of claim 25, wherein the film thickness for a region j of a wafer in chamber i in the model of step (a) is determined according to the equation:

$$\text{Film\_thickness}_{ij} = g(x_1, x_2, \ldots, x_n)_{ij} \cdot \text{time}_i$$

where Film_thickness$_i$ is the film thickness of region i of the wafer in chamber i; $X_1, x_2, \ldots, x_n$ are recipe parameters or tool state parameters which effect the deposition rate within this region; g( ) is a function, either linear or nonlinear, which describes the dependency of these parameters upon the deposition rate within region j of chamber i; and time$_i$ is the deposition time in chamber i.

27. The method of claim 1, wherein updated deposition recipe is attained by solving the equation:

$$\min_x f(y^{sp}, g(x))$$

where x is a vector of recipe parameters and other processing parameters corresponding to the deposition recipe; g(x) is the model for the deposition process, $y^{sp}$ is a vector of the one or more film properties; and $f(y^{sp}, g(x))$ is a penalty function to compensate for the deviation between the model predictions g(x) and the desired thicknesses $y^{sp}$.

28. A method of determining a model for film deposition in a chemical vapor deposition process, comprising:
(a) depositing a film on at least one wafer in a chemical vapor deposition process using a deposition recipe having at least one deposition recipe parameter that and at least one tool parameter corresponds to a deposition model variable;
(b) identifying a plurality of substantially annular regions of the at least one wafer and measuring a film property of at least two of said plurality of regions for each of the at least one wafers after the deposition of step (a);
(c) recording the deposition parameter and the measured film property for at least two of the plurality of regions for each of the at least one wafers on a recordable medium; and
(d) fitting the data to establish a relationship between the film property of a substantially annular region of the wafer and the deposition model variable.

29. The method of claim 28, wherein the film property of interest is selected from the group consisting of film thickness, stress, refractive index, dopant concentration and extinction coefficient.

30. The method of claim 28, wherein the at least one deposition parameter comprises one or more parameters selected from the group consisting of deposition time, wafer temperature, ozone flow rate, oxygen flow rate, reactive gas flow rate, carrier gas flow rate, dopant gas flow rate, chamber pressure and shower head spacing from the wafer.

31. The method of claim 28, wherein the model constrains a deposition parameter in a deposition recipe to be within predetermined maximum and minimum values.

* * * * *